United States Patent
Pye

(10) Patent No.: US 10,122,341 B2
(45) Date of Patent: Nov. 6, 2018

(54) COUPLED-LINE BALUN WITH COMMON-MODE NULLING

(71) Applicant: ANALOG DEVICES, INC., Norwood, MA (US)

(72) Inventor: Andrew Pye, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/366,966

(22) Filed: Dec. 1, 2016

(65) Prior Publication Data

US 2018/0123551 A1    May 3, 2018

Related U.S. Application Data

(60) Provisional application No. 62/415,138, filed on Oct. 31, 2016.

(51) Int. Cl.
*H03H 7/42* (2006.01)
*H01P 5/10* (2006.01)

(52) U.S. Cl.
CPC .............. *H03H 7/422* (2013.01); *H01P 5/10* (2013.01)

(58) Field of Classification Search
CPC ............ H03H 11/32; H01P 5/10; H03F 3/601
USPC ......... 333/25, 26, 172; 330/53, 54, 117, 301
See application file for complete search history.

(56) References Cited

U.S. PATENT DOCUMENTS

| | | | | |
|---|---|---|---|---|
| 4,039,977 A * | 8/1977 | Schmidt | .................. | H04B 3/141 333/28 R |
| 4,135,064 A * | 1/1979 | Lichtenstein | ............ | H04B 3/40 379/398 |
| 5,060,298 A * | 10/1991 | Waugh | ................. | H03D 7/1441 330/277 |
| 5,239,402 A * | 8/1993 | Little, Jr. | ................ | H03F 3/082 250/214 A |
| 6,531,943 B2 * | 3/2003 | Niu | .......................... | H03H 7/42 333/25 |
| 6,809,581 B2 * | 10/2004 | Rofougaran | ............. | H03H 7/42 333/25 |
| 6,993,312 B1 * | 1/2006 | Salib | .................... | H03D 9/0633 455/323 |

(Continued)

OTHER PUBLICATIONS

Reeder, Rob, "Transformer-Coupled Front-End for Wideband A/D Converters", Analog Dialogue 39-04, Apr. 2005. Available at http://www.analog.com/analogdialogue. 4 pages.

(Continued)

*Primary Examiner* — Dean Takaoka
(74) *Attorney, Agent, or Firm* — Knobbe, Martens, Olson & Bear, LLP

(57) ABSTRACT

Coupled-line baluns with common-mode compensation are provided herein. In certain configurations, a series resistor-inductor (RL) network is connected to ports of a coupled-line balun to null the common-mode transmission coefficient at a desired frequency. This extends performance at lower frequencies by improving the low frequency amplitude and phase balance of the device. The inductor and resistor can be connected in series between one of the differential terminals and a single-ended grounded terminal. This advantageously can null the common-mode transmission at a specific frequency near a minimum length-dominated frequency so as to enhance the common-mode rejection at lower frequencies.

20 Claims, 16 Drawing Sheets

(56) References Cited

U.S. PATENT DOCUMENTS

| | | | |
|---|---|---|---|
| 7,603,091 B2 * | 10/2009 | Shin | H04B 1/18 |
| | | | 333/25 |
| 8,742,851 B2 * | 6/2014 | Jahanian | H03F 1/3211 |
| | | | 330/286 |
| 9,312,815 B2 | 4/2016 | Wang et al. | |
| 2009/0133083 A1 | 5/2009 | Klein et al. | |
| 2010/0231316 A1 | 9/2010 | Jiang | |

OTHER PUBLICATIONS

Pozar, D., "Microwave Engineering", $2^{nd}$ Ed., John Wiley and Sons, 1998, pp. 383-393.

Mongia, R.K., "RF and Microwave Coupled-Line Circuits", $2^{nd}$ Ed, Norwood, MA, Artech House, 2007, Secs. 13.3-13.4, pp. 482-493.

Ruthroff, C.L., "Some Broad-Band Transformers", Proceedings of the IRE, vol. 47, No. 8, pp. 1337-1342., Aug. 1959.

\* cited by examiner

COUPLED-LINE BALUN WITH COMMON-MODE NULLING

CROSS-REFERENCE TO RELATED APPLICATIONS

The present application claims priority to U.S. Provisional Patent Application No. 62/415,138, filed Oct. 31, 2016, and titled "COUPLED-LINE BALUN WITH COMMON-MODE NULLING," the entirety of which is hereby incorporated herein by reference.

FIELD OF THE DISCLOSURE

Embodiments of the invention relate to electrical circuits, and more particularly to, coupled-line baluns.

BACKGROUND

A balun can operate between a balanced differential transmission path and an unbalanced, single-ended transmission path. Baluns can be used in a wide variety of electronic devices, including, for example, radio frequency and microwave electronics. Example applications for baluns include frequency multipliers, phase shifters, modulators, and dipole antenna feeds.

SUMMARY OF THE DISCLOSURE

Coupled-line baluns with common-mode compensation are provided herein. In certain configurations, a series resistor-inductor (RL) network is connected to ports of a coupled-line balun to null the common-mode transmission coefficient at a desired frequency. This extends performance at lower frequencies by improving the low frequency amplitude and phase balance of the device. The inductor and resistor can be connected in series between one of the differential terminals and a single-ended grounded terminal. This advantageously can null the common-mode transmission at a specific frequency near a minimum length-dominated frequency so as to enhance the common-mode rejection at lower frequencies.

In one aspect, an electronic system with common-mode compensation is provided. The electronic system includes a substrate and a coupled-line balun over the substrate. The coupled-line balun includes a first stripline including a first end configured to carry an unbalanced signal and a second end configured to carry a first component of a balanced signal, a second stripline adjacent to the first stripline and including a first end configured to receive a reference voltage and a second end configured to carry a second component of the balanced signal, and a series RL network including a resistor and an inductor electrically connected in series between the second end of the first stripline and the reference voltage. The series RL network is operable to control a common-mode response characteristic of the coupled-line balun.

In another aspect, a method of signal transformation with common-mode compensation is provided. The method includes providing signal transformation using a coupled-line balun, including handling an unbalanced signal using a first terminal of the coupled-line balun, handling a first component of a balanced signal using a second terminal of the coupled-line balun, and handling a second component of the balanced signal using a third terminal of the coupled-line balun. The method further includes receiving a reference voltage for the unbalanced signal at a fourth terminal of the coupled-line balun, and controlling a common-mode response of the coupled-line balun using a series RL network connected between the second terminal and the fourth terminal.

In another aspect, a coupled-line balun with common-mode compensation includes a first terminal configured to carry an unbalanced signal, a second terminal configured to carry a first component of a balanced signal, a third terminal configured to carry a second component of the balanced signal, a fourth terminal configured to receive a reference voltage for the unbalanced signal, and a series RL network electrically connected between the second terminal and the fourth terminal.

BRIEF DESCRIPTION OF THE DRAWINGS

These drawings and the associated description herein are provided to illustrate specific embodiments of the invention and are not intended to be limiting.

DETAILED DESCRIPTION

Figure 1A:
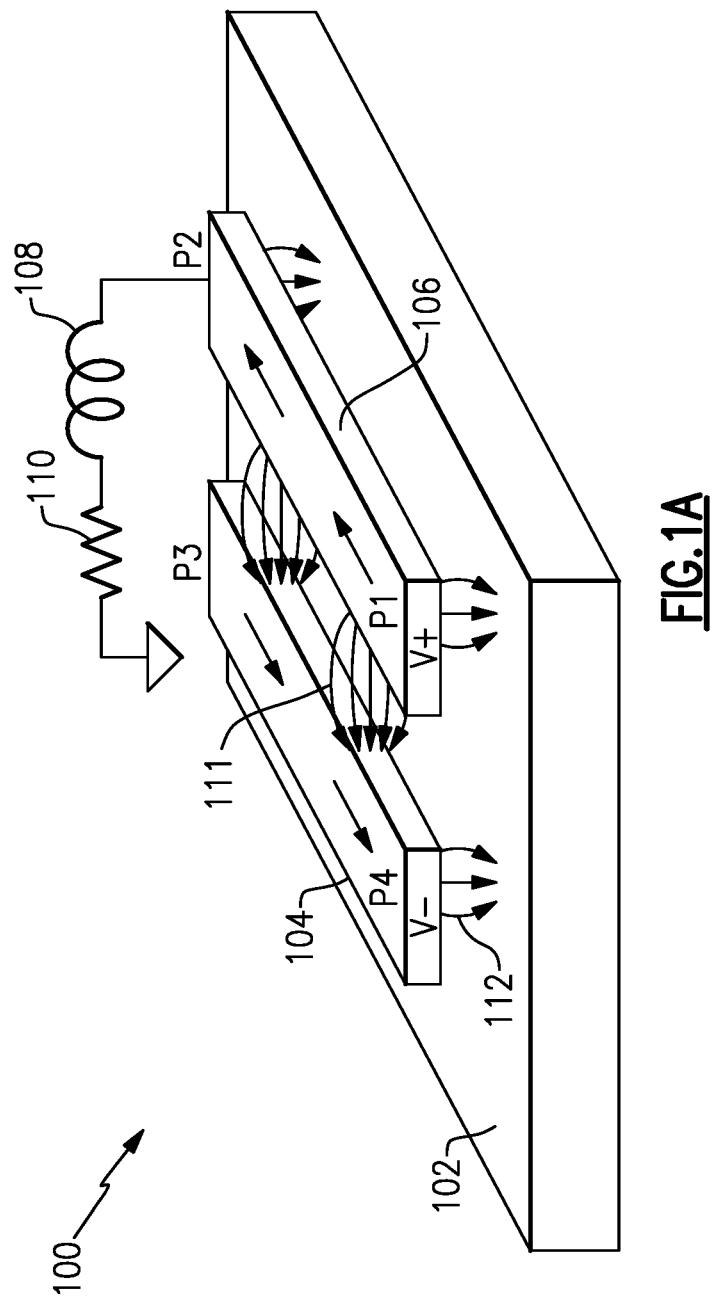
FIG. 1A is an overhead perspective view of a coupled-line balun with common-mode nulling according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Baluns can be used in radio frequency (RF) systems, including, but not limited to microwave systems. As persons of ordinary skill in the art will appreciate, RF and microwave signal frequencies collectively cover a wide frequency range, for example, 3 kHz to 300 GHz.

To enhance integration of RF and microwave systems, it is desirable to incorporate a balun in a semiconductor die, such as a monolithic microwave integrated circuit (MMIC). Advantages of integration include size reduction and large-scale production, which in turn results in lowered costs. Examples of fabrication processes suitable for MMICs include, but are not limited to, silicon-on-insulator (SOI) processes and compound semiconductor processes, such as silicon germanium (SiGe) or gallium arsenide (GaAs) technologies.

A coupled-line balun can be formed using coplanar striplines, also referred to as micro-striplines, of conductive material positioned over a substrate.

In certain configurations, a balun can receive a single-ended RF input signal and output a differential RF output signal. It is desirable for the non-inverted and inverted components of the differential RF output signal to have equal amplitude, and a phase shift of 180 degrees.

For wide bandwidth applications, it is desirable for a balun to convert an unbalanced input signal into a balanced differential output signal over a broad range of frequencies. Additionally, it is desirable for the balun to exhibit high common-mode rejection, corresponding to a measure of on how well the coupled-line balun blocks or rejects a common-mode component of the unbalanced input from the balanced output, or vice-versa.

The present inventor has recognized that a coupled-line balun has a minimum frequency limit based on a wavelength of the input signal. When the wavelength becomes commensurate or greater than the electrical length of the balun's stripline, the properties of the stripline deviate from a transmission-line model. At low input frequencies, unwanted coupling to a ground plane can degrade common-mode rejection and allow unwanted common-mode signal feed-through.

Common-mode rejection can be analyzed by observing the amount of reflection or absorption of even-mode signals. For example, if two signals with the same amplitude and phase are injected into the balanced ports of a coupled-line balun, the signals can be reflected or absorbed. Under these conditions, the mode is referred to as even mode. Alternatively, when the injected signals at the balanced ports are equal in amplitude and opposite in phase, then the mode is referred to as an odd mode. Thus, an even-mode signal is also a common-mode signal, and an odd-mode signal is also a differential-mode signal.

In considering the common-mode rejection of a coupled-line balun, the transmission of the odd-mode signals relative to the even-mode signals can be analyzed by determining (for instance, calculating and/or measuring) a transmission coefficient from an input port to an output port. For example, the scattering matrix parameter S21 is one example of a suitable parameter, and can be used to quantify the amount of transmission in units of decibels (dB). Common-mode rejection and common-mode rejection ratio can be determined by comparing the scattering parameter S21 of the differential-mode (odd-mode) signals to that of the common-mode (even-mode) signals.

Other important performance specifications include phase balance and amplitude balance. Phase balance measures how closely a phase difference between a pair of components of a differential output signal compares with a 180 degrees (out-of-phase) phase separation. Amplitude balance indicates a degree of matching between the output power magnitudes of a pair of components of a differential output signal. In one example, phase balance is expressed in units of degrees and amplitude balance is expressed in units of dB.

When the frequency of a signal reduces such that the signal wavelength becomes commensurate with the electrical length of the stripline (micro-stripline), the striplines begin to have characteristics of lumped components (R, L, C). In turn, the transfer of energy between the striplines becomes reduced.

Performance at low frequencies, where the wavelength of the signal is commensurate with the stripline electrical length, can also be degraded through coupling to the substrate. A relatively high coupling to the substrate and/or to the backside (for instance, a package paddle to which a die including the balun is attached), as well as to surrounding circuitry, can reduce lower frequency performance by reducing common-mode rejection and degrading phase and amplitude balance.

In a coupled-line balun, common-mode rejection can be analyzed in terms of an even-mode impedance ($Z_{0e}$) and an odd-mode impedance ($Z_{0o}$). Even-mode impedance $Z_{0e}$ is the characteristic impedance present when the input signals are even-mode signals, while odd-mode impedance $Z_{0o}$ is the characteristic impedance present when the output signals are odd-mode signals.

In certain implementations, it is desirable to increase or maximize the ratio of even-mode mode impedance $Z_{0e}$ to odd-mode impedance $Z_{0o}$. Implementing a coupled-line balun in this manner extends the overall bandwidth of the balun and improves common-mode rejection at low frequencies.

Fabricating a balun on a high resistivity substrate, such as a silicon-on-insulator (SOI) substrate, can lessen the coupling to the substrate or ground plane. However, implementing a balun on a high resistivity substrate alone may provide insufficient common-mode rejection at low frequency. Moreover, it is also desirable to provide low common-mode rejection in other types of processes, such as semiconductor technologies in which a high resistivity substrate may not be readily available or when the substrate is thinned, increasing capacitance to the backside of the die.

There is a need for a coupled-line balun having improved phase balance and amplitude at lower frequencies. Moreover, there is a need for a coupled-line balun that can be used in a wide range of processing technologies, and that provides robust common-mode rejection, including at low frequencies where signal wavelength is commensurate to stripline electrical length.

Coupled-line baluns with common-mode compensation are provided herein. In certain implementations, a coupled-line balun includes a first terminal or port that carries an unbalanced signal, a second terminal that carries a first or non-inverted component of a balanced signal, a third terminal that carries a second or inverted component of the balanced signal, and a fourth terminal that receives a reference voltage (for instance, ground) for the unbalanced signal. The coupled-line balun includes a series resistor-inductor (RL) network electrically connected between the second terminal and the reference voltage. The series RL network has resistance and inductance values selected to reduce or null the common-mode response of the balun at a desired low frequency, thereby enhancing low frequency amplitude and phase balance.

Thus, the series RL network is connected to ports of a coupled-line balun to null the common-mode transmission coefficient (for example, the common-mode scattering parameter S21) at a desired frequency. The desired frequency can be selected from a low frequency range, thereby enhancing low frequency common-mode rejection. Thus, the baluns disclosed herein are suitable for wide bandwidth applications. When the common-mode transmission coefficient is nulled, both the amplitude balance and phase balance can approach ideal values.

In certain implementations, the series RL network includes one or more variable components to tune the nulling frequency. For example, the resistor can be made variable to provide user control of the nulling frequency.

As used herein, a "variable" component includes components having controllable value, including, but not limited to analog-tuned components and/or digitally-tuned components, such as digitally programmable components.

Accordingly, a manufacturer and/or user can control the bandwidth performance of the balun by controlling the nulling frequency. In one example, a resistor can be trimmed using a switch network to tune the desired nulling frequency. In another example, a manufacturer sets fuse/anti-fuses and/or programs data to a non-volatile memory to program an integrated circuit (IC) with data that controls the IC's nulling frequency.

The common-mode compensation improves performance, such as by reducing common-mode feedthrough, by nulling the common-mode transmission coefficient at a nulling frequency near a minimum length-dominated frequency. The inductor and resistor can be connected in series between one of the differential terminals and a single-ended grounded terminal. Consequently, the phase balance and amplitude balance approach ideal performance values at the nulling frequency.

The series RL network can be implemented to enhance operation at lower frequencies, while providing little or no degradation to high-frequency performance. Advantageously, the inductor can operate as an open circuit at higher frequencies so that the LR network has substantially no impact to high frequency operation.

The teachings here are applicable to transforming an unbalanced signal to a balanced signal and/or transforming a balanced signal to an unbalanced signal.

For example, in one aspect, a method of unbalanced to balanced signal conversion includes receiving an unbalanced signal as an input to a first terminal of coupled-line balun, providing a first component of a balanced signal to a second terminal of the coupled-line balun, providing a second component of the balanced signal to a third terminal of the coupled-line balun, receiving a reference voltage for the unbalanced signal to a fourth terminal of the coupled-line balun, and controlling a common-mode response of the coupled-line balun using a series RL network connected between the second terminal and the fourth terminal. In another aspect, a method of balanced to unbalanced signal conversion includes receiving a first component of a balanced signal at the second terminal of the coupled-line balun, providing an unbalanced signal to the first terminal of the coupled line balun, receiving a second component of the balanced signal at the third terminal of the coupled-line balun, and receiving a reference voltage for the unbalanced signal at the fourth terminal of the coupled-line balun. The series RL network is connected between the second terminal and the fourth terminal to control the common-mode response of the coupled-line balun.

FIG. 1A is an overhead perspective view of a coupled-line balun 100 with common-mode nulling according to one embodiment. The overhead perspective view depicts a stripline (micro-stripline) realization of a coupled-line balun 100. As shown in FIG. 1A, the coupled-line balun 100 includes a first stripline 106, a second stripline 104, an inductor 108, and a resistor 110, and is formed over a substrate 102.

In certain implementations, the coupled-line balun 100 is fabricated using an MMIC process such as SiGe where the substrate 102 is silicon. However, other implementations are possible. For example, the teachings herein are not only applicable to coupled-line baluns implemented on integrated circuits or semiconductor dies, but also to coupled-line baluns implemented in other ways. For instance, a coupled-line balun can be implemented using lumped elements on a PCB. In another example, a coupled-line balun is implemented on a laminated substrate of a module or package.

The striplines 104, 106 are patterned to be in close proximity for adequate coupling of the electric and magnetic fields and to meet balun specifications. In the illustrated embodiment, the striplines 104, 106 each have a length l.

The inductor 108 can be implemented in a wide variety of ways. In one example, the inductor 108 is patterned in one or more conductive layers of the die. For instance, the inductor 108 can be implemented as a lumped element using a spiral pattern or equivalent. In one implementation, the inductor 108 has a value of inductance ranging from 10 nH to 30 nH. However, other implementations are possible. The inductor 108 corresponds to an explicit inductor, and not to mere parasitic inductance. However, parasitic inductance can be taken into account when selecting an inductance value of the inductor 108.

The resistor 110 can be implemented in a wide variety of ways. In one example, the resistor 110 is patterned as a lumped element using a thin film resistor or equivalent. In one implementation, the resistor 110 has a resistance ranging from 10 ohm (Ω) to 100Ω. In certain implementations, the resistor 110 is implemented using a transistor. For example, a field-effect transistor can be biased to provide a channel resistance, which can serve as the resistor 110. The resistor 110 corresponds to an explicit resistor, and not to mere parasitic resistance. However, parasitic resistance can be taken into account when selecting a resistance value of the resistor 110.

In certain implementations, the resistor 110 and/or inductor 108 have controllable values to aid in achieving a controllable nulling frequency.

As shown in FIG. 1A, the electrical connections of the coupled-line balun 100 are delineated by terminals or ports P1, P2, P3, and P4. The stripline 106 can operate as a transmission line between ports P1 and P2; and as described above, an important scattering parameter is S21, which quantifies how well a signal transmits from port P1 to port P2. The second stripline 104 between ports P3 and P4 can be configured to couple power from the first stripline 106 and to provide the coupled signal to port P3. The port P4 is terminated and connected to ground. In this manner, the coupled-line balun 100 can operate as a three port device.

In certain implementations, a differential signal is outputted between ports P2 and P3. Thus, the ports P2 and P3 can also be referred to as the differential ports of the coupled-line balun 100. Additionally, the port P1 can receive a single-ended signal, and may be referred to as the unbalanced port of the coupled-line balun 100.

In such implementations, the coupled-line balun 100 transforms an unbalanced signal into a balanced signal. However, the coupled-line balun 100 can also be used to provide transformation between a balanced signal and an unbalanced signal. For example, the coupled-line balun 100 can receive a balanced signal between the ports P2 and P3, and output an unbalanced signal at port P1.

FIG. 1A depicts an odd-mode signal condition where the stripline 106 propagates a voltage signal V+ while the stripline 104 couples an inverted voltage signal V−. It is desirable for the voltage signal V− to be equal in amplitude and 180 degrees out of phase with voltage signal V+. However, phase balance can degrade due to a variety of factors.

Also shown in FIG. 1A are electric field (E-field) lines 111 and 112. E-field lines depict the transfer of energy due to electric fields within the coupled-line balun 100. The coupled-line balun also supports magnetic fields (H-fields), not shown in the figure for clarity of the figures. For instance, E-field lines 112 depict the transfer of energy from the stripline 104 to the substrate 102, while E-field lines 111 depict the transfer of energy between the stripline 104 and the stripline 106.

The energy transfer to the substrate 102 can arise from operation of the substrate as a ground plane. The amount of energy transfer to the ground plane can depend upon the resistivity of the substrate and distance from the striplines. For instance, in SiGe processes in which the silicon substrate has a relatively low resistivity, there can be a significant amount of energy transferred from the striplines 104, 106 to the substrate 102 and/or to a packaging paddle to which the substrate 102 is attached.

The coupled-line balun 100 can be designed to operate so that the first stripline 106 and the second stripline 104 provide good common-mode rejection over a specified bandwidth having a minimum length-dominated frequency of operation. For instance, the coupled-line balun 100 can have a bandwidth of a decade or more. However, for lower frequencies at or near the minimum length-dominated frequency of operation, the signal wavelength becomes commensurate with the stripline electrical length 1. Absent compensation, the common-mode rejection can be poor.

The inductor 108 and the resistor 110 are connected in series, and serves as a series RL network between the port P2 and ground. The series RL network formed by the inductor 108 and the resistor 110 can extend the bandwidth of operation to frequencies lower than the minimum length-dominated frequency by nulling common-mode signals in the frequency domain.

Phase balance can degrade at the minimum length-dominated frequency where the stripline electrical length is relatively short with respect to the wavelength of the signal. This in turn can lead to poor common-mode rejection, resulting in a common-mode signal at the differential ports.

Although FIG. 1A illustrates a specific order of the resistor 110 and inductor 108 in series, the order can be reversed. For example, the resistor 110 can be positioned between the second port P2 and the inductor 108.

Figure 1B:
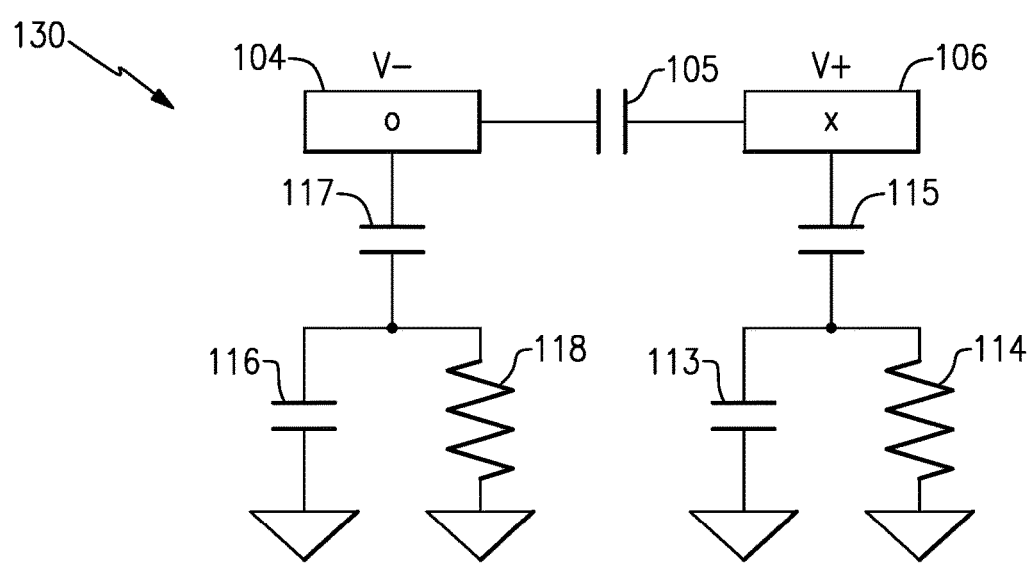
FIG. 1B is one example of a partial lumped circuit model along a cross-section axis of the coupled-line balun of FIG. 1A.
Figure 1C:
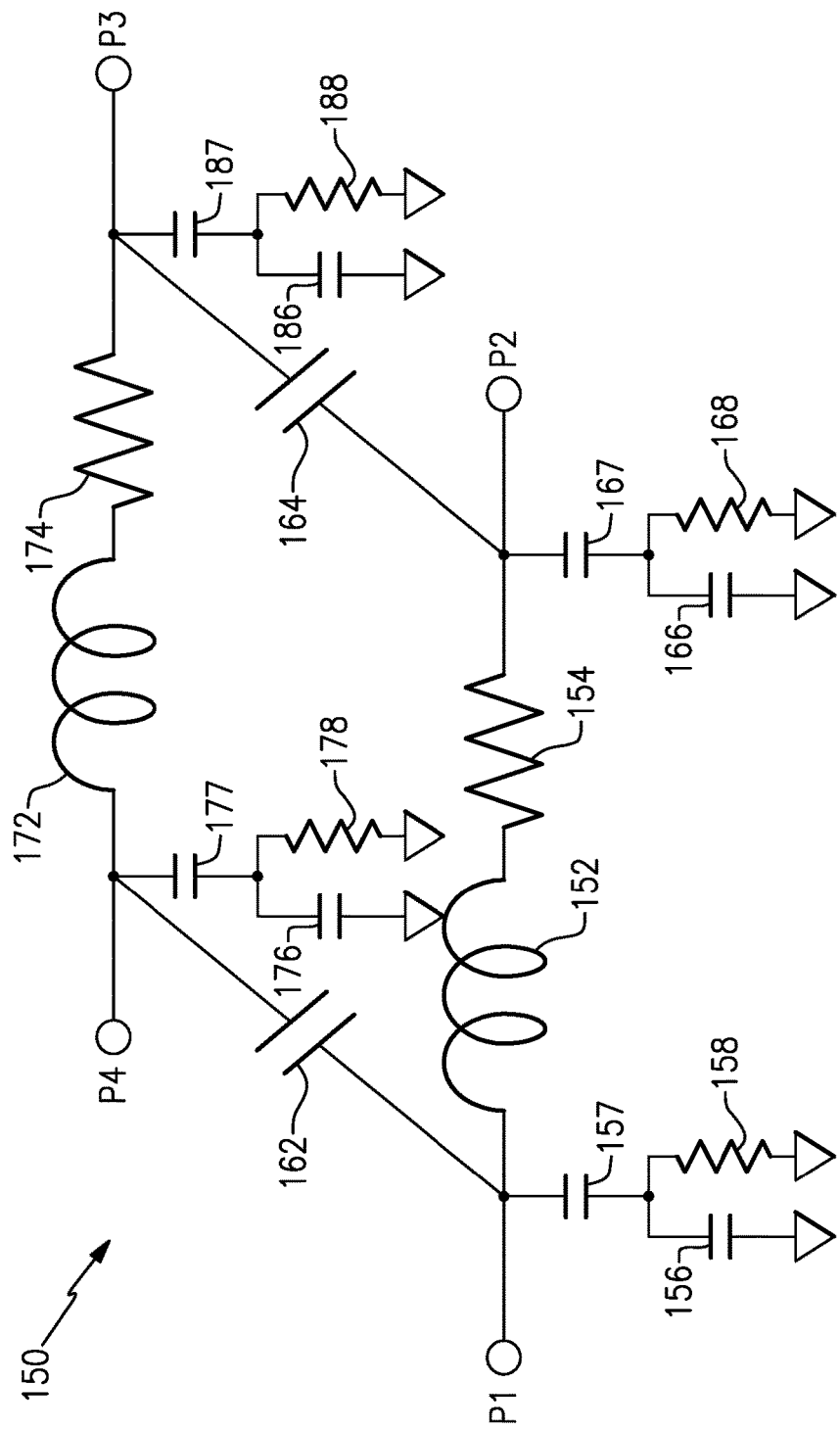
FIG. 1C is one example of multi-port lumped circuit model of the coupled-line balun of FIG. 1A.

FIGS. 1B and 1C illustrate lumped circuit models of the coupled-line balun 100 of FIG. 1A. Certain operational behaviors of the coupled-line balun 100 at frequencies near the minimum length-dominated frequency will be discussed below with respect to FIGS. 1B and 1C.

FIG. 1B is one example of a partial lumped circuit model 130 along a cross-section axis of the coupled-line balun 100 of FIG. 1A. The partial lumped circuit model 130 includes a cross-section of stripline 104 and stripline 106, and it also includes capacitors 105, 113, 115, 116, 117 and resistors 114 and 118. The capacitor 105 is electrically connected between the stripline 104 and the stripline 106 to model the capacitance and/or coupling between the striplines 104 and 106.

As shown in FIG. 1B, the capacitor 117 is electrically connected between the stripline 104 and a first end of the capacitor 116. The second end of the capacitor 116 is electrically connected to ground. Additionally, the resistor 118 is electrically connected in parallel with the capacitor 116. The capacitor 117 can model the thin film or oxide capacitance between the stripline 104 and the substrate 102, while the capacitor 116 and the resistor 118 can model the substrate's capacitance and resistance. The capacitor 116 and the resistor 118 model coupling between the top of the substrate 102 and the bottom of the substrate 102, which can be connected to a die attach paddle.

With continuing reference to FIG. 1B, the capacitor 115 is shown to be electrically connected between the stripline 106 and a first end of the capacitor 113. The second end of the capacitor 113 is electrically connected to ground. Additionally, the resistor 114 is electrically connected in parallel with the capacitor 113. The capacitor 115 can model the thin film or oxide capacitance between the stripline 106 and the substrate 102, while the capacitor 113 and the resistor 114 can model the capacitance and resistance associated with the substrate. The capacitor 113 and the resistor 114 together can model the coupling between the top of the substrate and the bottom portion of the substrate connected to the paddle.

FIG. 1C is one example of multi-port lumped circuit model 150 of the coupled-line balun 100 of FIG. 1A. The multi-port lumped circuit model 150 provides a lumped circuit model of the coupled-line balun 100 for frequencies near the minimum length-dominated frequency. The multi-port lumped circuit model 150 includes inductors 152, 172, capacitors 156, 157, 162, 164, 166, 167, 176, 177, 186, 187, and resistors 154, 158, 168, 174, 178, 188.

The inductor 152 and the resistor 154 are electrically connected in series between the ports P1 and P2 and are a lumped circuit model of the stripline 106. Similarly, the inductor 172 and the resistor 174 are electrically connected in series between the ports P4 and P3 and are a lumped circuit model of the stripline 104. Capacitor 162, electrically connected between ports P1 and P4, and capacitor 164, electrically connected between ports P2 and P3, model the electrical coupling between the striplines 104 and 106.

The lumped network formed by capacitors 156 and 157 with resistor 158 model the coupling between the stripline 106 at node P1 to the ground plane/paddle. The capacitor 157 is electrically connected between port P1 and a first end of the capacitor 156. The second end of the capacitor 156 is electrically connected to ground. Additionally, the resistor 158 is electrically connected in parallel with the capacitor 156. The capacitor 157 can model the thin film or oxide capacitance between the stripline 106 at port P1 and the substrate 102, while the capacitor 156 and the resistor 158 can model the capacitance and resistance associated with the substrate. The capacitor 156 and the resistor 158 together can model the coupling between the top of the substrate and the bottom portion of the substrate connected to the paddle.

The lumped network formed by capacitors 166 and 167 with resistor 168 can model the coupling between the stripline 106 at node P2 to the ground plane/paddle. The capacitor 167 is electrically connected between port P2 and a first end of the capacitor 166. The second end of the capacitor 166 is electrically connected to ground. Additionally, the resistor 168 is electrically connected in parallel with the capacitor 166. The capacitor 167 can model the thin film or oxide capacitance between the stripline 106 at port P2 and the substrate 102, while the capacitor 166 and the resistor 168 can model the capacitance and resistance associated with the substrate. The capacitor 166 and the resistor 168 together can model the coupling between the top of the substrate and the bottom portion of the substrate connected to the paddle.

The lumped network formed by capacitors 176 and 177 with resistor 178 model the coupling between the stripline 104 at node P4 to the ground plane/paddle. The capacitor 177 is electrically connected between port P4 and a first end of the capacitor 176. The second end of the capacitor 176 is electrically connected to ground. Additionally, the resistor 178 is electrically connected in parallel with the capacitor 176. The capacitor 177 can model the thin film or oxide capacitance between the stripline 104 at port P4 and the substrate 102, while the capacitor 176 and the resistor 178 can model the capacitance and resistance associated with the substrate. The capacitor 176 and the resistor 178 together can model the coupling between the top of the substrate and the bottom portion of the substrate connected to the paddle.

Additionally, the lumped network formed by capacitors 186 and 187 with resistor 188 model the coupling between the stripline 104 at node P3 to the ground plane/paddle. The capacitor 187 is electrically connected between port P3 and a first end of the capacitor 186. The second end of the capacitor 186 is electrically connected to ground. Furthermore, the resistor 188 is electrically connected in parallel with the capacitor 186. The capacitor 187 can model the thin film or oxide capacitance between the stripline 104 at port P3 and the substrate 102, while the capacitor 186 and the resistor 188 can model the capacitance and resistance associated with the substrate. The capacitor 186 and the resistor 188 together can model the coupling between the top of the substrate and the bottom portion of the substrate connected to the paddle.

Although one example of partial lumped circuit models for the coupled-line balun 100 are shown in FIGS. 1B and 1C, other models are possible.

The multi-port lumped circuit models of FIGS. 1B and 1C can provide insight into how process parameters can affect a coupled-line balun's common-mode rejection at lower frequencies near the minimum length-dominated frequency. For instance, the resistors 158, 168, 178 and 188 show that for low-resistivity processes, such as SiGe processes, there can be more direct coupling from the striplines 104 and 106 to the paddles. The direct coupling can further degrade common-mode rejection.

The resistor 110 and inductor 108 of the series RL network of FIG. 1A are used to provide common-mode compensation arising from these and/or other effects.

Figure 2:
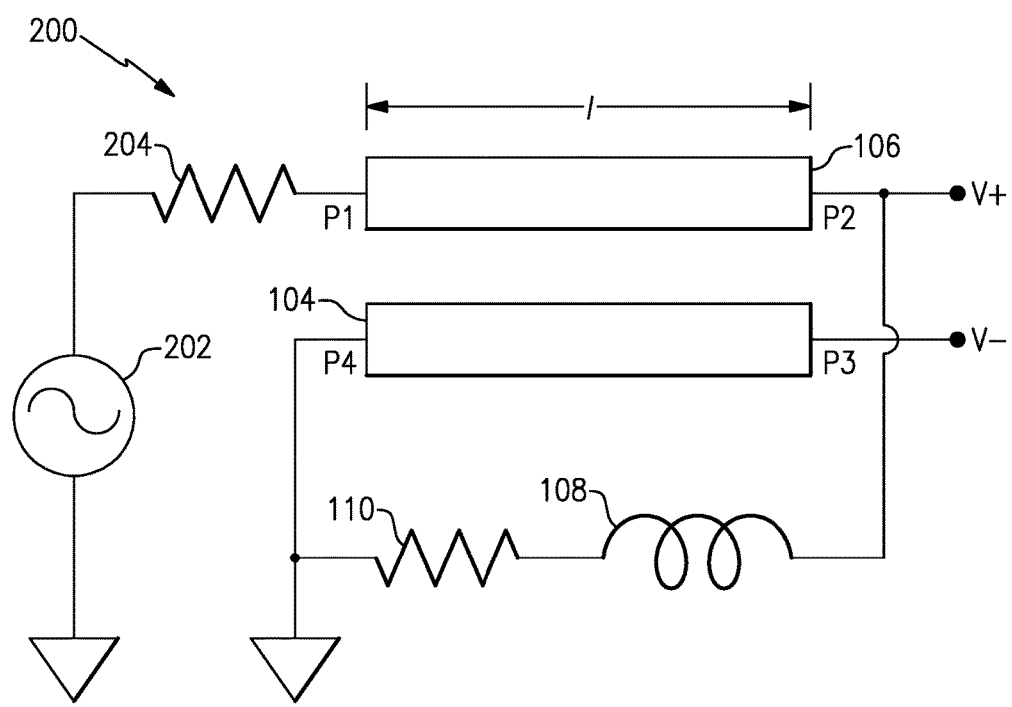
FIG. 2 is a schematic diagram of a coupled-line balun with common-mode nulling according to one embodiment.

FIG. 2 is a schematic diagram 200 of a coupled-line balun with common-mode nulling using a compensation resistor 110 and an inductor 108 according to another embodiment. In this embodiment, the coupled-line balun is arranged in an unbalanced-to-balanced configuration. The schematic diagram 200 shows a voltage signal source 202, a source impedance 204, a stripline 104, a stripline 106, the resistor 110, and the inductor 108. Although illustrated for the case of a source resistance, the source impedance 204 can more generally be an impedance $Z_S$.

Although the schematic diagram 200 is shown for an unbalanced-to-balanced configuration, the teachings herein are also applicable to baluns that operate in a balanced-to-unbalanced configuration. For example, a balun can be implemented to receive a balanced signal and output an unbalanced signal and/or to receive an unbalanced signal and output a balanced signal.

In one embodiment, the coupled-line balun of FIG. 2 is fabricated on an integrated circuit or semiconductor die. In such an implementation, the striplines 104 and 106 can correspond to metallization of the IC (for instance, back-end metallization) formed over a substrate. Additionally, the resistor 110 and the inductor 108 can be fabricated over the substrate (for instance, as a thin film resistor and an inductor structured formed from patterned metallization layer(s)). However, other implementations are possible.

For example, in another embodiment, the striplines 104 and 106 correspond to trace formed on a PCB substrate, and the resistor 110 and/or the inductor 108 correspond to discrete components attached to the PCB substrate. In yet another embodiment, the striplines 104 and 106 correspond to trace of a package or module substrate (e.g. laminate), and the resistor 110 and/or the inductor 108 correspond to discrete module components, such as surface mount components. In certain implementations, the inductor 108 is implemented in all or part using trace of a PCB or module substrate, for instance, by patterning the trace as a spiral inductive structure.

The stripline 104 and the stripline 106 have a stripline length l and operate as a coupled-line balun similar to the coupled-line balun 100 of FIG. 1A. A first end of the stripline 106 corresponds to the port P1, and the second end of the stripline 106 corresponds to the port P2. Additionally, a first end of the stripline 104 corresponds to the port P4, and a second end of the stripline corresponds to the port P3. Furthermore, port P4 is electrically connected to a reference voltage such as ground, and the resistor 110 and the inductor 108 are connected in series between port P2 and ground at P4. The signal source 202 and the source impedance 204 are electrically connected in series between ground and the port P1.

The signal source 202 provides a voltage signal through the source impedance 204 to the single-ended unbalanced port P1. The voltage signal is a single-ended, common-mode signal, in this embodiment. The coupled-line balun can be configured to transform the single-ended signal to differential and attenuate the common-mode signal component so that the signal V+ at port P2 and the signal V− at port P3 operate as a differential signal with good phase and amplitude balance. When the signals V+ and V− have an ideal 180 degrees phase difference, the phase balance is said to be zero degrees. In practice, the phase balance can deviate from zero degrees, and the larger the deviation, the poorer the common-mode rejection. Amplitude imbalance will also degrade common-mode rejection.

Additionally, the scattering parameter S21 for the common-mode signal component can be compared to the scattering parameter S21 of the differential-mode signal component in order to assess common-mode rejection. The common-mode rejection ratio is related to how much larger the differential-mode signal component scattering parameter S21, referred to as the differential S21, is compared to the common-mode signal component scattering parameter S21, referred to as the common-mode S21.

The series RL network, consisting of the resistor 110 and the inductor 108, operate to null common-mode signals at a frequency at or near the minimum length-dominated frequency. As will be discussed below with respect to the examples shown in FIGS. 3A-6B, the resistor 110 and inductor 108 can improve the lower limit of the bandwidth in a coupled-line balun by nulling the common-mode S21 at a frequency near the minimum length-dominated frequency.

Figure 3A:
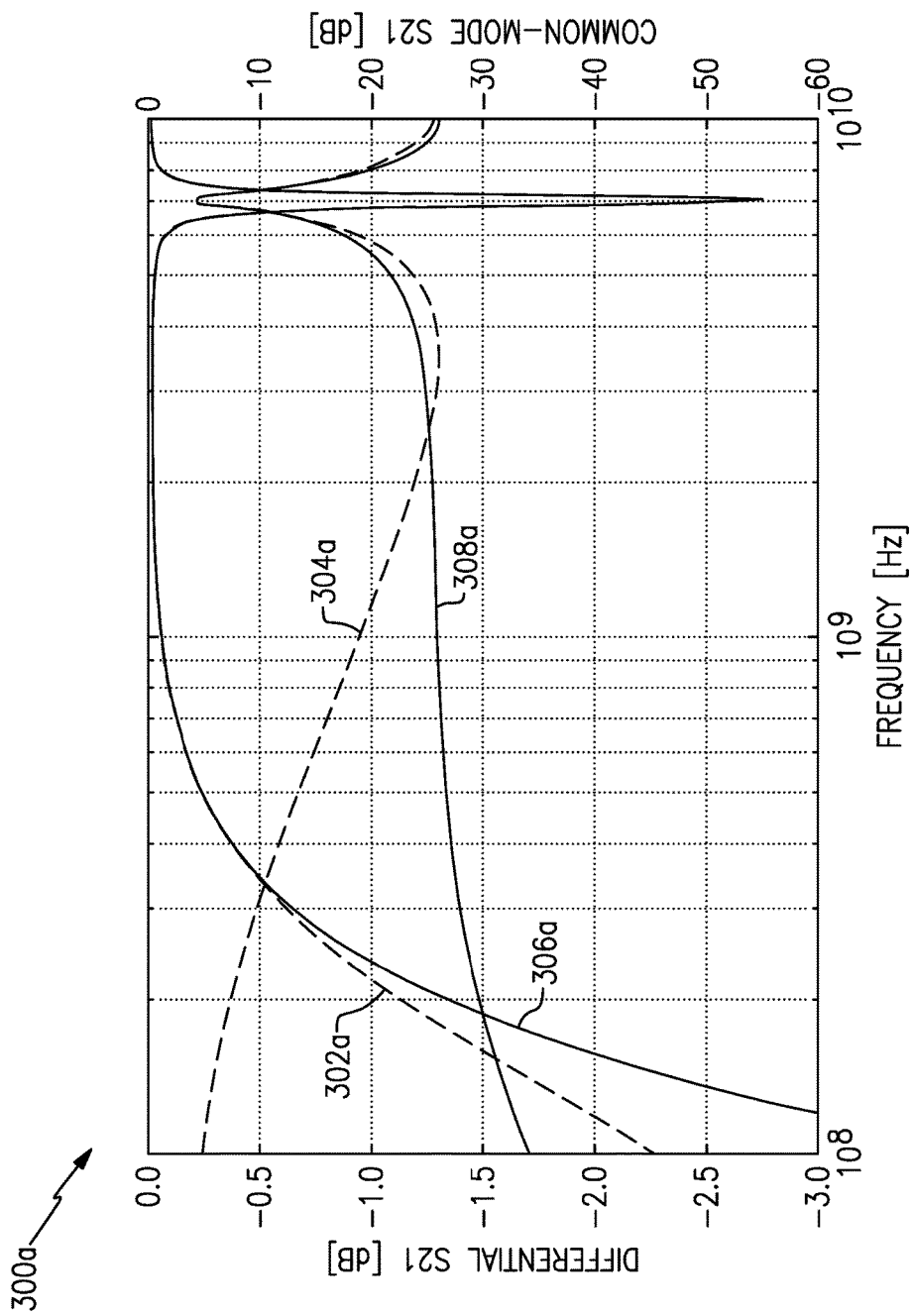
FIG. 3A is a graph comparing differential-mode and common-mode transmission scattering coefficients in a lossless medium for a coupled-line balun without common-mode compensation and for a coupled-line balun with common-mode compensation according to one embodiment.

FIG. 3A is a graph 300a comparing differential-mode and common-mode transmission scattering coefficients in a lossless medium for a coupled-line balun without common-mode compensation and for a coupled-line balun according to another embodiment with common-mode compensation. The material parameters can be based on a coupled-line balun as described above in FIG. 1A and/or FIG. 2 and realized in an MMIC process such as a SiGe process.

The graph 300a shows a plot 302a of differential S21, a plot 306a of differential S21, a plot 304a of common-mode S21, and a plot 308a of common-mode S21 in units of decibels (dB) as a function of frequency in hertz (Hz). Additionally, the differential S21 axis is shown having a scale between 0 and −3.0 dB and opposite to the common-mode S21 axis shown having a scale between 0 and −60 dB. For comparing the relative effect of including the resistor 110 and the inductor 108, the plots 302a and 304a correspond to a coupled-line balun that omits the series resistor 110 and the inductor 108, while the plots 306a and 308a correspond to the coupled-line balun including the inductor 108 and the resistor 110. The plots 306a and 308a correspond to an embodiment where inductor 108 has a value of 16.1 nanohenries (nH) and the resistor 110 has a resistance of zero or almost zero ohms.

Comparison of the differential S21 plot 302a to the differential S21 plot 306a, shows that with the addition of inductor 108 and when the resistance of the resistor 110 is small or zero relative the impedance of the inductor 108, there is little effect on differential S21. Comparison of the common-mode S21 plot 304a to the common-mode S21 plot 308a shows that there is improvement in the common-mode S21 with the addition of the series inductor 108. From the graph 300a it can be seen that the differential S21 bandwidth of plot 302a, which is determined by where the differential S21 magnitude intercepts −1 dB, is greater than a decade. However, the common-mode S21 of plot 304a has a magnitude greater than −20 dB below 1.2 GHz. Thus, using a criterion of magnitude greater than 20 dB, the common-mode S21 is poor for frequencies less than 1.2 GHz, even though the differential S21 bandwidth extends well below 1 GHz.

The coupled-line balun is said to have common-mode rejection when its differential S21 is greater than its common-mode S21. The magnitude difference in decibels between the differential S21 and the common-mode S21 can be used as a measure of common-mode rejection ratio. Graph 300a shows the coupled-line balun of plots 306a and 308a has some, albeit limited improvement in common-mode rejection compared to the coupled-line balun of plots 302a and 304a. The improved common-mode rejection below 1 GHz is estimated to be about 25 to 30 dB. The limited amount of improvement can be attributed to the fact that the resistance of the resistor 110 is small or negligible.

Figure 3B:
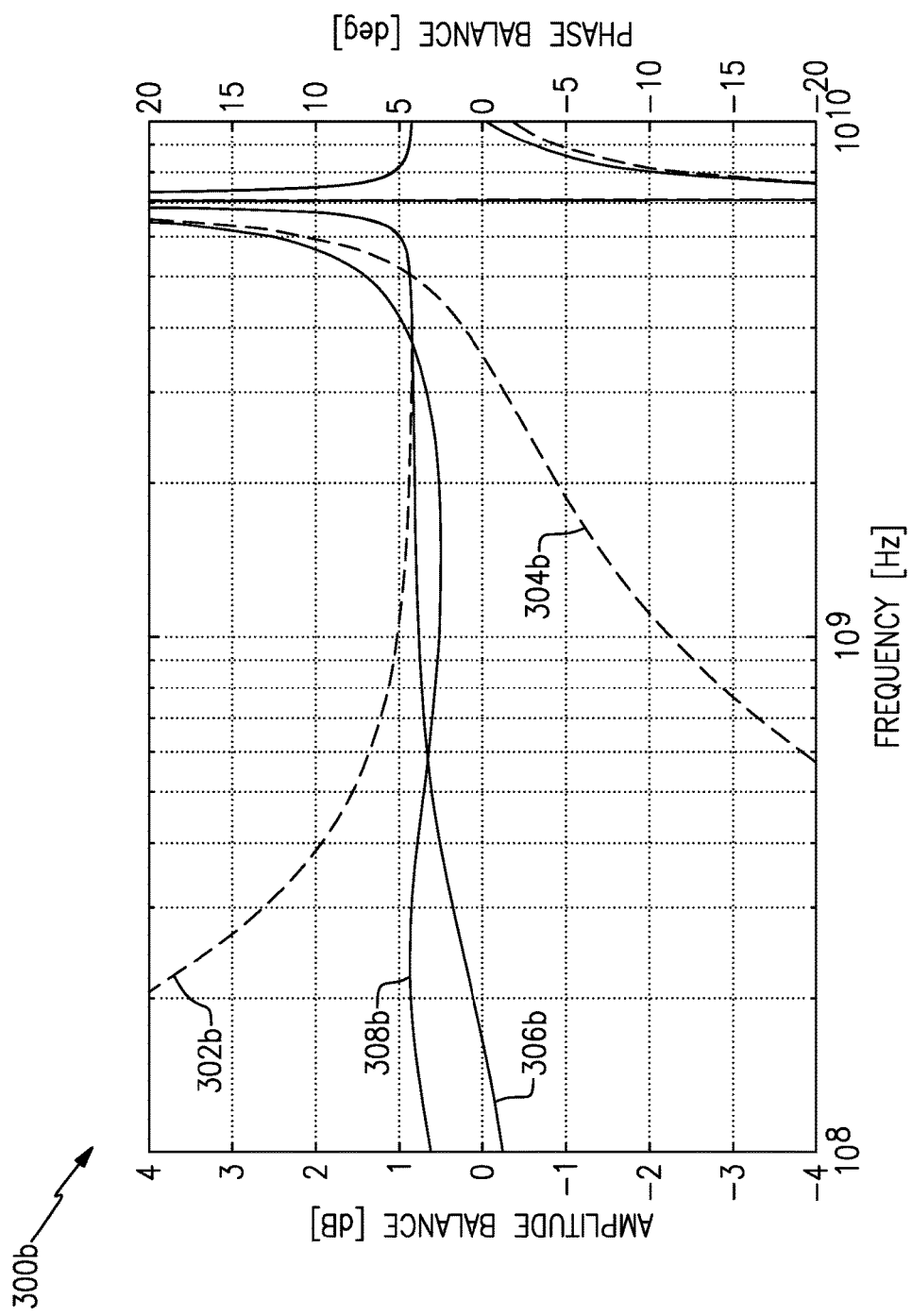
FIG. 3B is a graph comparing plots of amplitude balance and phase balance in a lossless medium for a coupled-line balun without common-mode compensation and for a coupled-line balun with common-mode compensation according to one embodiment.

FIG. 3B is a graph 300b comparing plots of amplitude balance and phase balance for the cases considered in FIG. 3A.

The graph 300b shows a plot 302b of amplitude balance, a plot 306b of amplitude balance, a plot 304b of phase balance, and a plot 308b of phase balance. Amplitude balance is measured in units of dB while phase balance is measured in units of degrees (deg). Additionally, the amplitude balance axis is shown having a scale between −4.0 and 4.0 dB and opposite to the phase balance axis shown having a scale between −20 and 20 deg. Similar to graph 300a, the graph 300b provides a comparison of the relative effect of including the resistor 110 and the inductor 108. The plots 302b and 304b correspond to the coupled-line balun that omits the series resistor 110 and the inductor 108, while the plots 306b and 308b correspond to the coupled-line balun including the inductor 108 and the resistor 110. The plots 306b and 308b correspond to the embodiment where inductor 108 has a value of 16.1 nanohenries (nH) and the resistor 110 has a resistance of zero or almost zero ohms.

Comparison of the amplitude balance plot 302b to the amplitude balance plot 306b, shows that with the addition of inductor 108 and when the resistance of the resistor 110 is small or zero, the amplitude balance remains bounded between +/−1 dB for lower frequencies. Comparison of the phase balance plot 304b to the phase balance plot 308b also shows that the phase balance remains between 0 and 5 deg for lower frequency values.

Figure 4A:
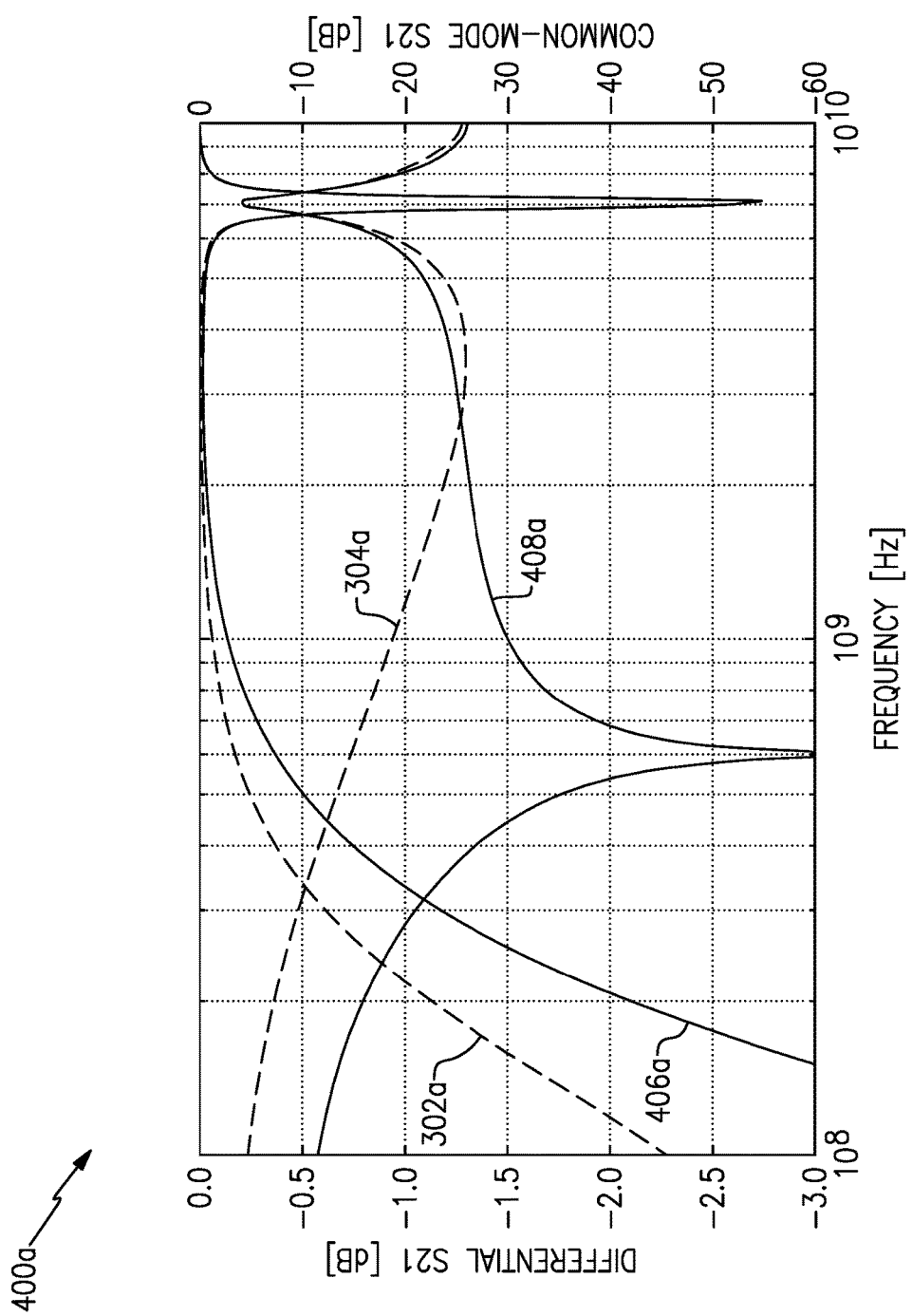
FIG. 4A is a graph comparing plots of differential-mode and common-mode transmission scattering coefficients in a lossless medium for a coupled-line balun without common-mode compensation and for a coupled-line balun with common-mode compensation according to one embodiment.

FIG. 4A is a graph 400a comparing plots of differential-mode and common-mode transmission scattering coefficients in a lossless medium for a coupled-line balun without common-mode compensation and for a coupled-line balun according to another embodiment. The material parameters can be based on a coupled-line balun as described above in FIG. 1A and/or FIG. 2 and realized in an MMIC process such as a SiGe process.

The graph 400a shows the plot 302a of differential S21, a plot 406a of differential S21, the plot 304a of common-mode S21, and a plot 408a of common-mode S21 in units of decibels (dB) as a function of frequency in hertz (Hz). Additionally, the differential S21 axis is shown having a scale between 0 and −3.0 dB and opposite to the common-mode S21 axis shown having a scale between 0 and −60 dB. For comparing the relative effect of including the resistor 110 and the inductor 108, the plots 302a and 304a again correspond to the coupled-line balun that omits the series resistor 110 and the inductor 108, while the plots 406a and 408a correspond to the coupled-line balun including the inductor 108 and the resistor 110. The plots 406a and 408a also correspond to another embodiment where inductor 108 has a value of 16.1 nH and the resistor 110 has a resistance 16.7 ohms.

Comparison of the differential S21 plot 302a to the differential S21 plot 406a, shows that the series resistor 110 and inductor 108 degrade the 1 dB bandwidth of differential S21 at lower frequencies; this minor degradation to the differential S21 is attributed to the addition of the series RL network. Comparison of the common-mode S21 plot 304a to the common-mode S21 plot 408a shows that the series resistor 110 and the inductor 108 improve the common-mode S21. As shown in graph 400a, the common-mode S21 is reduced or cancelled (nulled) at 600 MHz by including the series resistor 110 and the inductor 108. By nulling the common-mode S21 at 600 MHz the common-mode rejection is greatly enhanced.

The teachings herein present compensation for providing the nulling of the common-mode S21 at a frequency determined, in part, by the series resistor 110 and the inductor 108. There can be an extension of bandwidth to lower frequency by positioning the nulling frequency so that the magnitude of the differential S21 is much greater than the magnitude of the common-mode S21 for lower frequencies.

Figure 4B:
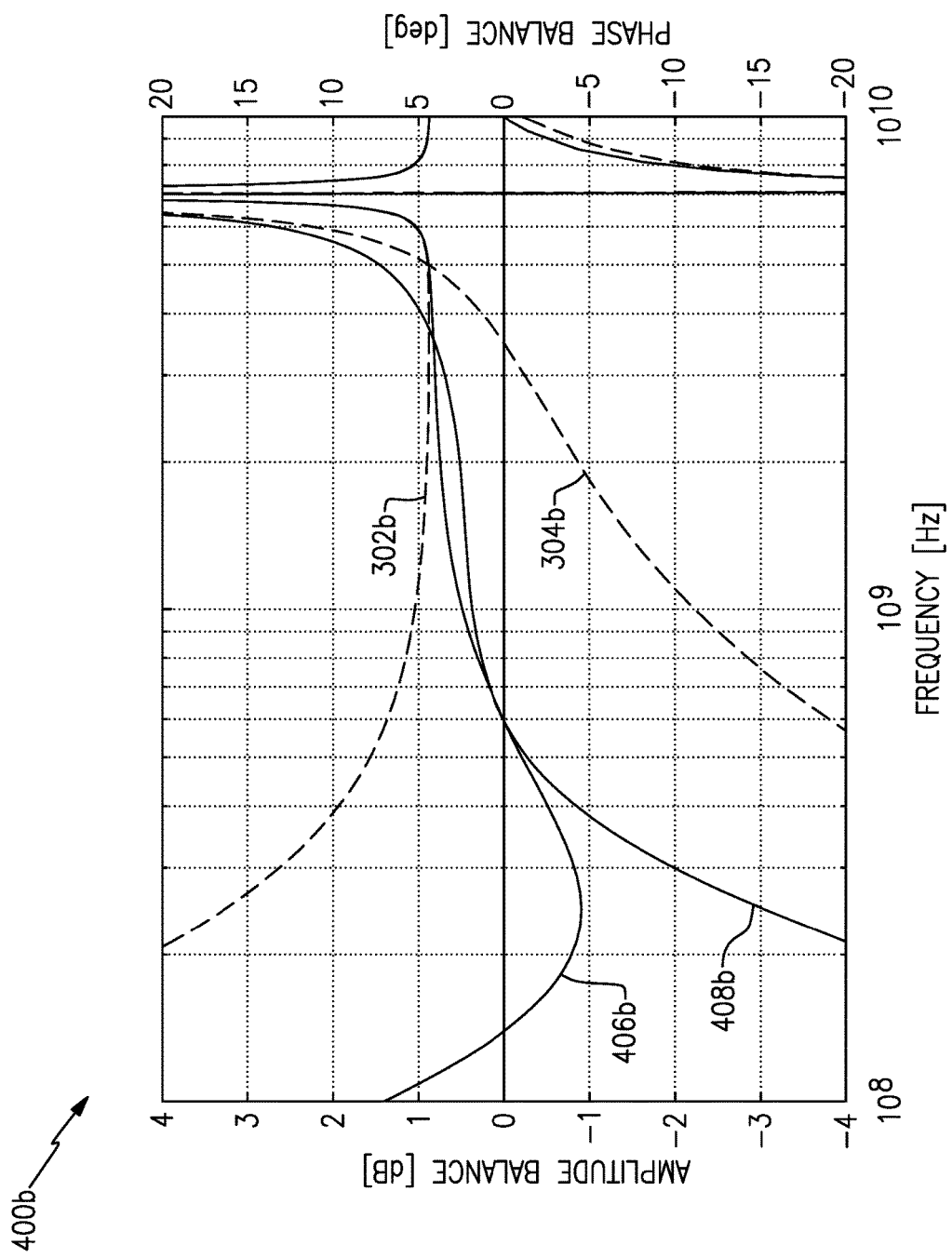
FIG. 4B is a graph comparing plots of amplitude balance and phase balance in a lossless medium for a coupled-line balun without common-mode compensation and for a coupled-line balun with common-mode compensation according to one embodiment.

FIG. 4B is a graph 400b comparing plots of amplitude balance and phase balance for the cases considered in FIG. 4A.

The graph 400b shows the plot 302b of amplitude balance, a plot 406b of amplitude balance, the plot 304b of phase balance, and a plot 408b of phase balance. Amplitude balance is measured in units of dB while phase balance is measured in units of degrees (deg). Additionally, the amplitude balance axis is shown having a scale between −4.0 and 4.0 dB and opposite to the phase balance axis shown having a scale between −20 and 20 deg. Similar to graph 400a, the graph 400b provides a comparison of the relative effect of including the resistor 110 and the inductor 108. The plots 302b and 304b correspond to the coupled-line balun that omits the series resistor 110 and the inductor 108, while the plots 406b and 408b correspond to the coupled-line balun including the inductor 108 and the resistor 110. The plots 406b and 408b correspond to the embodiment where inductor 108 has a value of 16.1 nH and the resistor 110 has a resistance 16.7 ohms. Plots 406b and 408b show that the phase balance and the amplitude balance are both zero at approximately 600 MHz, corresponding to the nulling frequency. Thus, there can be a correlation between the nulling frequency (600 MHz) and where the amplitude balance and phase balance are simultaneously reduced to zero.

FIGS. 3A-4B are based on a lossless coupled-stripline balun model. More details of the parameters and design equations are presented below.

The coupled-mode balun of FIGS. 3A-4B have a stripline length l of 10.7 millimeters (mm) corresponding to the length of the stripline 104 and the stripline 106 of the coupled-line balun 100 of FIG. 1A or FIG. 2 and designed to operate at a center frequency $f_c$ of 3.5 gigahertz (GHz). Additionally, although the stripline length l is 10.7 mm with a center frequency $f_c$ is 3.5 GHz, other configurations having stripline lengths greater than or less than 10.7 mm and/or center frequencies greater than or less than 3.5 GHz are possible.

The parameters used in deriving the plots of FIGS. 3A-4B also include the phase constant $\beta$, the phase velocity $v_p$, the even-mode characteristic impedance $Z_{0e}$, and the odd-mode characteristic impedance $Z_{0o}$. Additionally, the derivation of the plots in FIGS. 3A-4B is based on a lossless medium, meaning that the signal attenuation constant $\alpha$ is equal to zero. For the coupled-line baluns of FIGS. 3A-4B, the even-mode characteristic impedance $Z_{0e}$ is equal to 500 ohms and the odd-mode characteristic impedance $Z_{0o}$ is equal to 25 ohms. Phase velocity $v_p$ is $1.5 \times 10^8$ m/s and phase constant $\beta$ is 25.1 rad/m at 600 MHz.

When the coupled-line balun is symmetrical, as shown in FIG. 1A, the properties of the coupled-line balun can be analyzed as a linear combination of even-mode and odd-mode excitations and impedances. The even-mode characteristic impedance $Z_{0e}$ and the odd-mode characteristic impedance $Z_{0o}$ relate to the characteristic impedances of the coupled lines under even-mode excitations and odd-mode excitations, respectively. The even-mode characteristic impedance $Z_{0e}$ can be defined as the characteristic impedance of the stripline 104 or the stripline 106 to the ground when both the striplines 104 and 106 are driven in-phase from equal sources of equal impedances and voltages and are properly terminated. Additionally, the odd-mode characteristic impedance $Z_{0o}$ can be defined as the characteristic impedance from the stripline 104 or the stripline 106 to the ground when both the striplines 104 and 106 are driven out of phase from equal sources of equal impedances and voltages and are properly terminated.

Mathematical design equations for the resistance R of the series resistor 110 and the inductance L of the inductor 108 in a lossless coupled-line balun are given by equations 1 and 2, respectively.

$$R = \frac{Z_{0o} Z_S \sin^2(\beta l)(Z_{0e} - Z_{0o})}{4 Z_{0o}^2 \sin^2(\beta l) + Z_S^2 \cos^2(\beta l)} \qquad \text{Eq. 1}$$

$$L = \frac{1}{\omega}\left[\frac{Z_S \cot(\beta l)}{2 Z_{0o}}\right] R \qquad \text{Eq. 2}$$

In equation 2 $\omega$ is the angular frequency of the frequency to be nulled in radians per second. Equations 1 and 2 are modified in lossy mediums having a non-zero attenuation constant $\alpha$. For non-zero attenuation constant Equations 1 and 2 become cast in the form of Equations 3 and 4 as follows.

$$R = \frac{Z_S(Z_{0e} - Z_{0o})\left(\begin{array}{c} 2Z_{0o}\cosh(2\alpha l) + Z_S \sinh(2\alpha l) - \\ 2Z_{0o}\cos(2\beta l) \end{array}\right)}{2\left(\begin{array}{c}(4Z_{0o}^2 + Z_S^2)\cosh(2\alpha l) + 4Z_{0o}Z_S\sinh(2\alpha l) + \\ (Z_S^2 - 4Z_{0o}^2)\cos(2\beta l)\end{array}\right)} \qquad \text{Eq. 3}$$

$$L = \frac{1}{\omega}\left[\frac{Z_S \sin(2\beta l)}{2Z_{0o}\cosh(2\alpha l) + Z_S\sinh(2\alpha l) - 2Z_{0o}\cos(2\beta l)}\right] R \qquad \text{Eq. 4}$$

In a lossy medium the graphs of FIGS. 3A-4B are modified by the inclusion of a non-zero attenuation constant $\alpha$. In order to study the benefit of the series resistor 110 and the inductor 108 in a lossy medium, the value of attenuation constant $\alpha$ is set equal to 50 decibels per meter (dB/m).

Figure 5A:
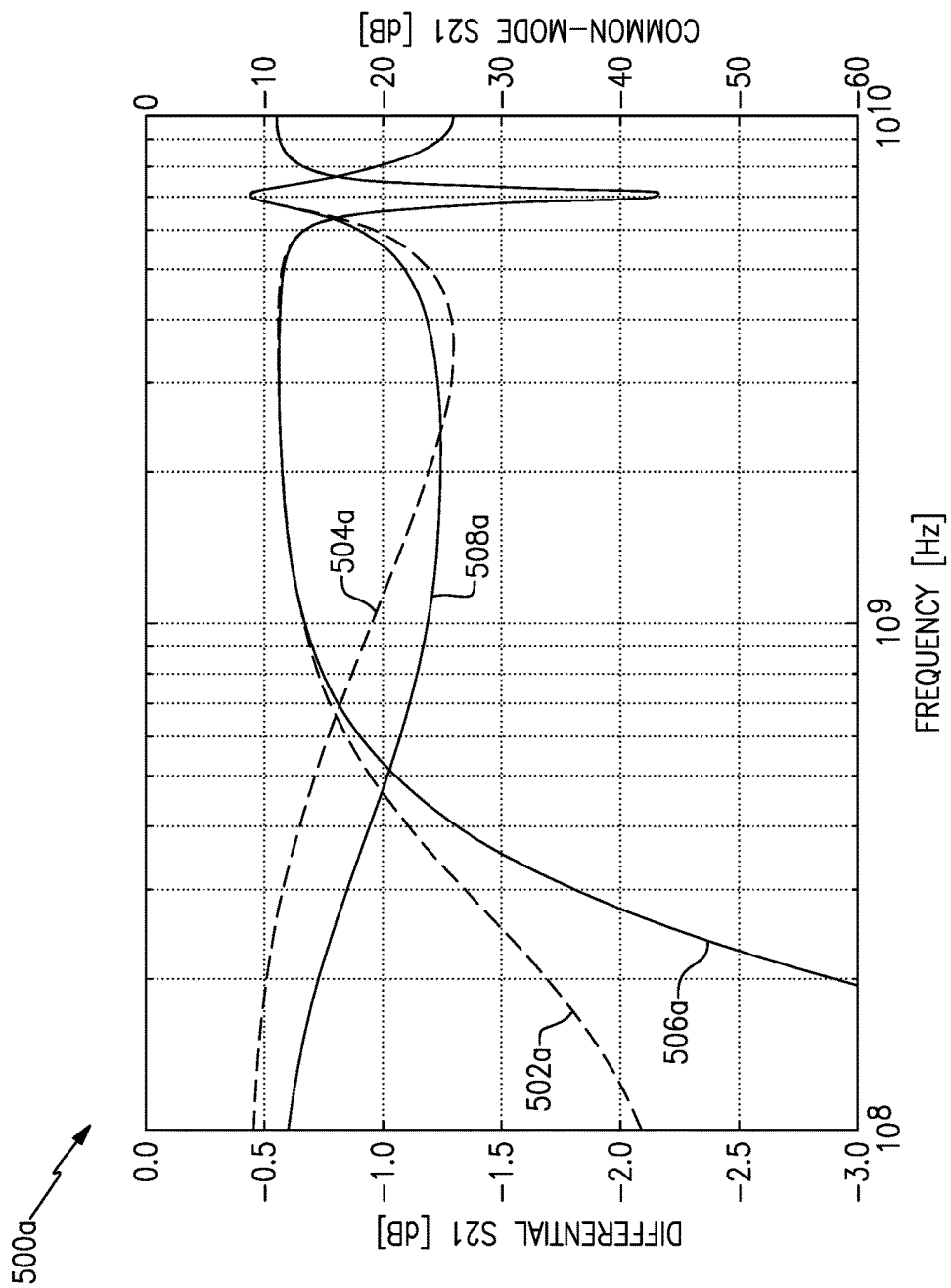
FIG. 5A is a graph comparing plots of differential-mode and common-mode transmission scattering coefficients for a lossy coupled-line balun without common-mode compensation and for a coupled-line balun with common-mode compensation according to one embodiment.

FIG. 5A is a graph 500a comparing plots of differential-mode and common-mode transmission scattering coefficients for a lossy coupled-line balun without common-mode compensation and for a coupled-line balun according to another embodiment. The graph 500a shows a plot 502a of differential S21, a plot 506a of differential S21, a plot 504a of common-mode S21, and a plot 508a of common-mode S21 in units of decibels (dB) as a function of frequency in hertz (Hz). The coupled-line balun corresponding to graph 500a is similar to the coupled-line balun corresponding to graph 300a, except the inductor 108 has an inductance value of 14.2 nH and the attenuation constant $\alpha$ is equal to 50 dB/m. The plots 502a, 506a, 504a, and 508a show a similar improvement to a coupled-line balun as the plots 302a, 306a, 304a, and 308a of graph 300a. For instance, the plots 306a and 308a show that the coupled-line balun with the inductor 108 and the resistor 110 has some improvement of common-mode rejection below 1 GHz limited to about 20 to 25 dB, even though the resistor 110 has a resistance of zero or almost zero.

Figure 5B:
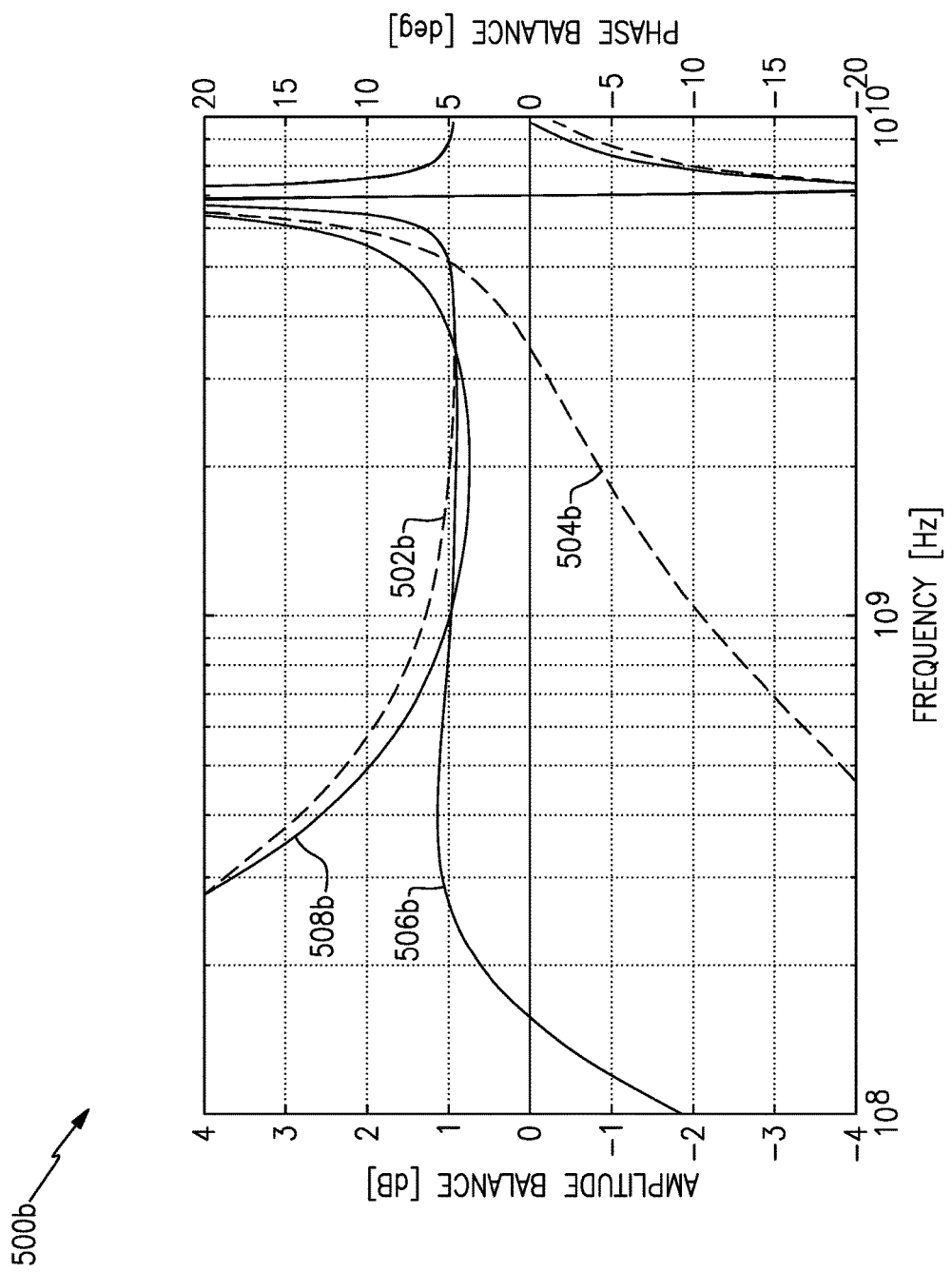
FIG. 5B is a graph comparing plots of amplitude balance and phase balance for a coupled-line balun without common-mode compensation and for a lossy coupled-line balun with common-mode compensation according to one embodiment.

FIG. 5B is a graph 500b comparing plots of amplitude balance and phase balance for a coupled-line balun without common-mode compensation and for a lossy coupled-line balun with common-mode compensation according to one embodiment. The graph 500b shows a plot 502b of amplitude balance, a plot 506b of amplitude balance, a plot 504b of phase balance, and a plot 508b of phase balance. The coupled-line balun corresponding to graph 500b is similar to the coupled-line balun corresponding to graph 300b, except the inductor 108 has an inductance value of 14.2 nH and the attenuation constant α is equal to 50 dB/m. The plots 502b, 506b, 504b, and 508b show a similar improvement to a coupled-line balun as described with respect to the plots 302b, 306b, 304b, and 308b of graph 300b.

Figure 6A:
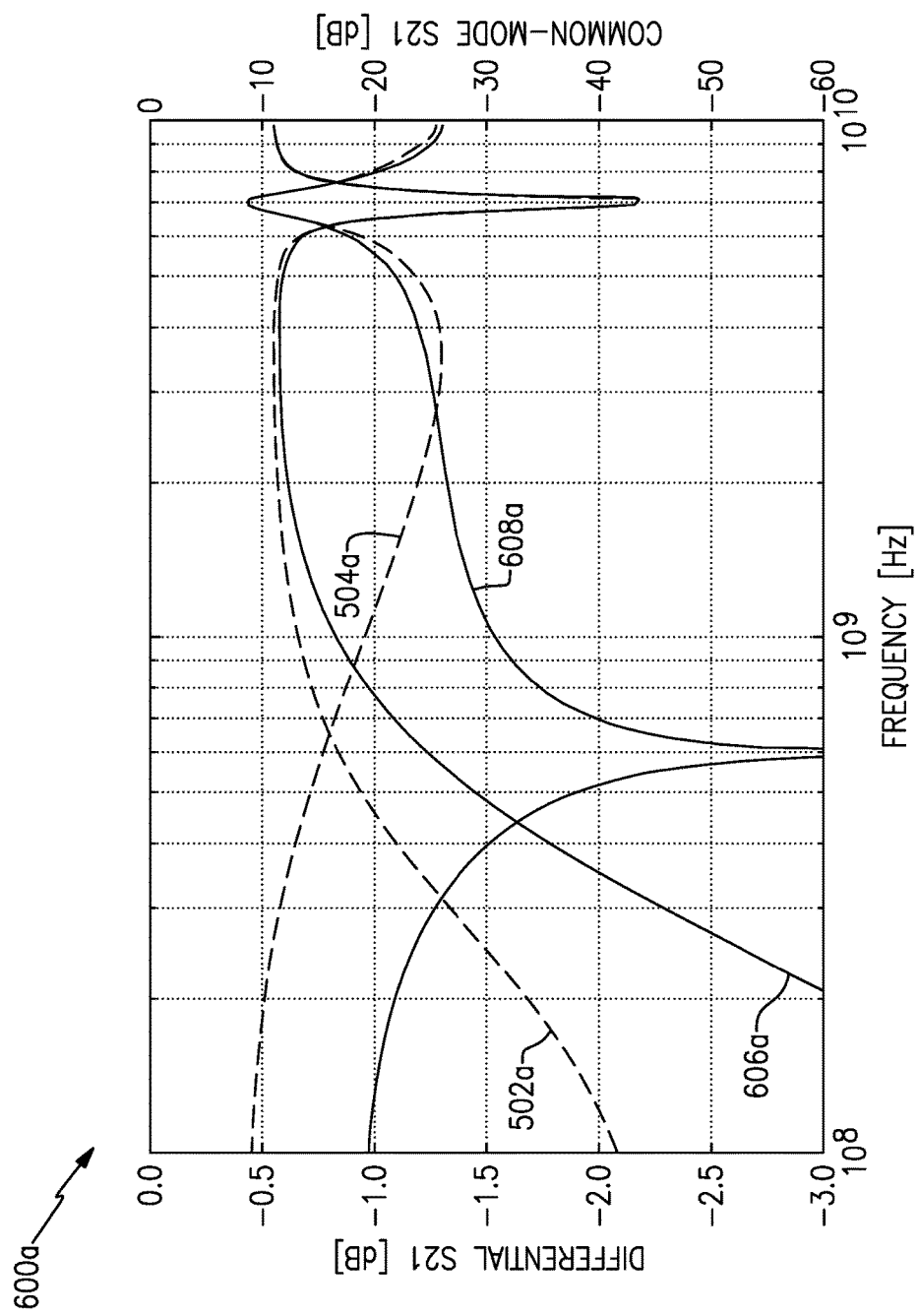
FIG. 6A is a graph comparing plots of differential-mode and common-mode transmission scattering coefficients for a lossy coupled-line balun without common-mode compensation and for a coupled-line balun with common-mode compensation according to one embodiment.

FIG. 6A is a graph 600a comparing plots of differential-mode and common-mode transmission scattering coefficients for a lossy coupled-line balun without common-mode compensation and for a coupled-line balun according to another embodiment. The graph 600a shows the plot 502a of differential S21, a plot 606a of differential S21, the plot 504a of common-mode S21, and a plot 608a of common-mode S21 in units of decibels (dB) as a function of frequency in hertz (Hz). The coupled-line balun corresponding to graph 600a is similar to the coupled-line balun corresponding to graph 400a, except the inductor 108 has an inductance value of 14.2 nH, the resistor 110 has a resistance of 28.5 ohms, and the attenuation constant α is equal to 50 dB/m. The plots 502a, 606a, 504a, and 608a show a similar improvement to a coupled-line balun as the plots 302a, 406a, 304a, and 408a of graph 400a. In particular, the series inductor 108 and resistor 110 compensates (improves) common-mode range by nulling the common-mode S21 at 600 MHz. This gives rise to superior common-mode rejection at lower frequencies.

Figure 6B:
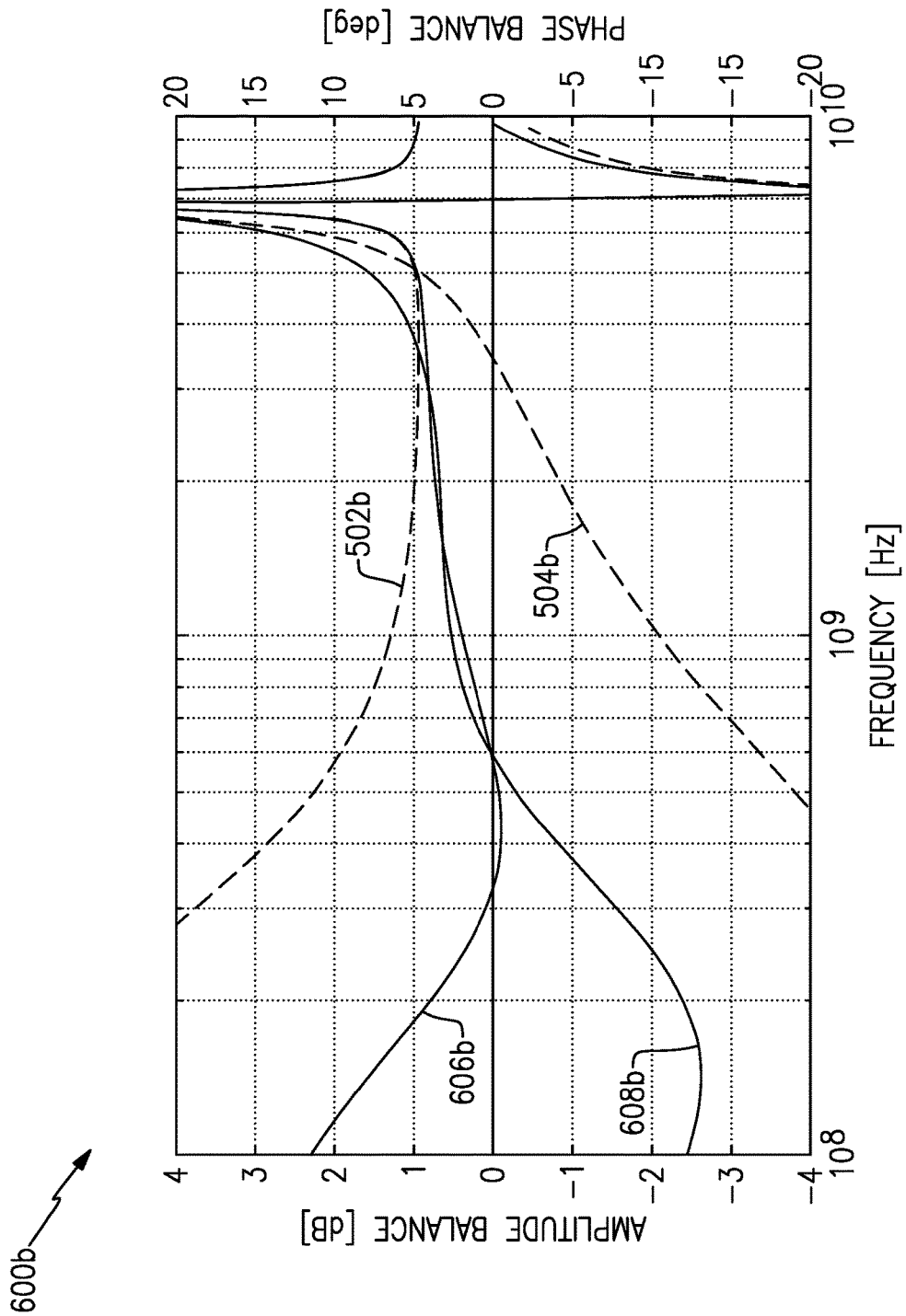
FIG. 6B is a graph comparing plots of amplitude balance and phase balance for a coupled-line balun without common-mode compensation and for a lossy coupled-line balun with common-mode compensation according to one embodiment.

FIG. 6B is a graph 600b comparing plots of amplitude balance and phase balance for a coupled-line balun without common-mode compensation and for a lossy coupled-line balun with common-mode compensation according to one embodiment. The graph 600b shows the plot 502b of amplitude balance, a plot 606b of amplitude balance, the plot 504b of phase balance, and a plot 608b of phase balance. The coupled-line balun corresponding to graph 600b is similar to the coupled-line balun corresponding to graph 400b, except the inductor 108 has an inductance value of 14.2 nH, the resistor 110 has a resistance of 28.5 ohms, and the attenuation constant α is equal to 50 dB/m. The plots 502b, 606b, 504b, and 608b show a similar improvement to a coupled-line balun as described for the plots 302b, 406b, 304b, and 408b of graph 400b. In particular, the series inductor 108 and resistor 110 cause the phase balance and the amplitude balance to be zero or almost zero at or around 600 MHz. This in turn shows that the nulling frequency corresponds to a frequency where the amplitude balance and phase balance are simultaneously equal to or almost equal to zero.

Figure 7:
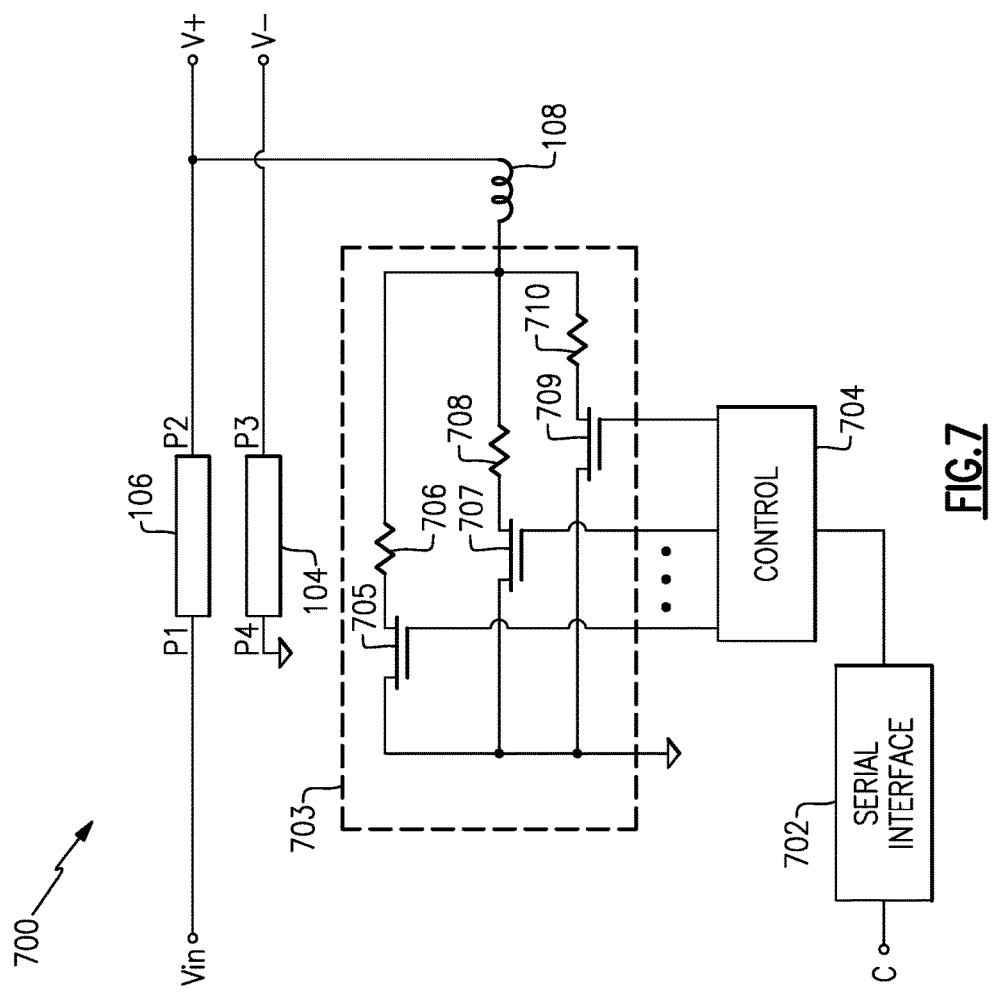
FIG. 7 is a schematic diagram of a coupled-line balun with common-mode nulling according to another embodiment.

FIG. 7 is a schematic diagram of a coupled-line balun 700 with common-mode nulling using a programmable resistor 703 and an inductor 108 according to another embodiment. The coupled-line balun 700 includes the striplines 104 and 106, the programmable resistor 703, the inductor 108, a control module 704, and a serial interface 702. The striplines 104, 106 operate as a coupled-line balun similar to the coupled-line balun 100 of FIG. 1A, with the port P4 electrically connected to ground. An input signal Vin is applied to the port P1 as an unbalanced signal. The coupled-line balun can transmit and couple the unbalanced signal Vin to the ports P2 and P3 to deliver a balanced differential signal having signal voltage V+ at port P2 and signal voltage V− at port P3.

The programmable resistor 703 and the inductor 108 are electrically connected in series between the port P2 and ground, and serve as a series RL network. As shown in FIG. 7, a first end of the inductor 108 is connected to the programmable resistor 703, and the second end of the inductor 108 is connected to the port P2. Thus, the inductor 108 is connected between the port P2 and the programmable resistor 703, in this embodiment. However, in another embodiment, the programmable resistor 703 is connected between the inductor 108 and the port P2.

In the illustrated embodiment, the programmable resistor 703 includes selectable resistance elements, and a switch network (transistor switches, in this embodiment) that control a resistance of the programmable resistor 703 by controlling selection of the resistance elements.

For example, the programmable resistor 703 includes transistors 705, 707, 709 and resistance elements 706, 708, and 710. The transistor 705 and the resistance element 706 are electrically connected in series between the first end of the inductor 108 and ground. Similarly, the transistor 707 and the resistance element 708 are electrically in series between the first end of the inductor 108 and ground, and the transistor 709 and the resistance element 710 are electrically connected in series between the first end of the inductor 108 and ground. Thus, the programmable resistor 703 and the inductor 108 operate in series between the port P2 and ground.

Although the programmable resistor 703 is shown to have three resistance elements 706, 708, 710 and three transistors 705, 707, 709, other configurations having greater or fewer transistors and/or resistance elements are possible. Indeed, a coupled-line balun can include tunable components implemented in a wide variety of ways. For example, in another embodiment, a programmable inductor of a series RL network includes selectable inductance elements and a switch network that controls selection of the inductance elements.

As shown in FIG. 7, the control module 704 can receive a signal from the serial interface 702 and provide gate control signals to each of the gates of the transistors 705, 705, and 709. Based on a control data C received by the serial interface 702, the control module 704 operates to control the gates of the transistors 705, 707, and 709 to control the resistance of the programmable resistor 703. The control module 704 can selectively control one or more of the transistors 705, 707, and 709 to operate as switches having an on (conducting) state and an off (blocking) state based on the control data C received via the serial interface 702. In this way, the of the programmable resistor 703 is given by the parallel resistance of one or more of the resistance elements 706, 708, or 710.

Although the programmable resistor 703 shows a means of providing variable resistance by using resistance elements and transistors, other configurations are possible. For instance, the transistors could be replaced by fuses and/or anti-fuses, and/or a variable resistor can be implemented using a trimmed resistor. In certain implementations, a value of a tunable component is controlled by data stored in a programmable memory, including, but not limited to, a non-volatile memory.

The programmable resistor 703 illustrates one implementation of the resistor 110 of FIG. 1A and FIG. 2. Additionally, the programmable resistor 703 operates as a variable resistor with resistance controlled by the control module 704. An advantage of controlling the resistance of the programmable resistor 703 is that it allows one to control the compensation properties of the series RL network.

For example, by changing the resistance of the series RL network, the frequency at which common-mode S21 is nulled to zero can be varied. For instance, instead of having the nulling frequency at 600 MHz as shown in graphs 400a of FIG. 4A, the nulling frequency could be adjusted to 550 MHz (in one example). Alternatively, having a programmable resistor 703 allows one to tune the nulling frequency in an MMIC process where the resistivity of the resistor 110 and the inductance of the inductor 108 vary due to process variations. Accordingly, in certain embodiments, a series RL network for common-mode nulling is tuned to provide compensation for process variation.

Figure 8A:
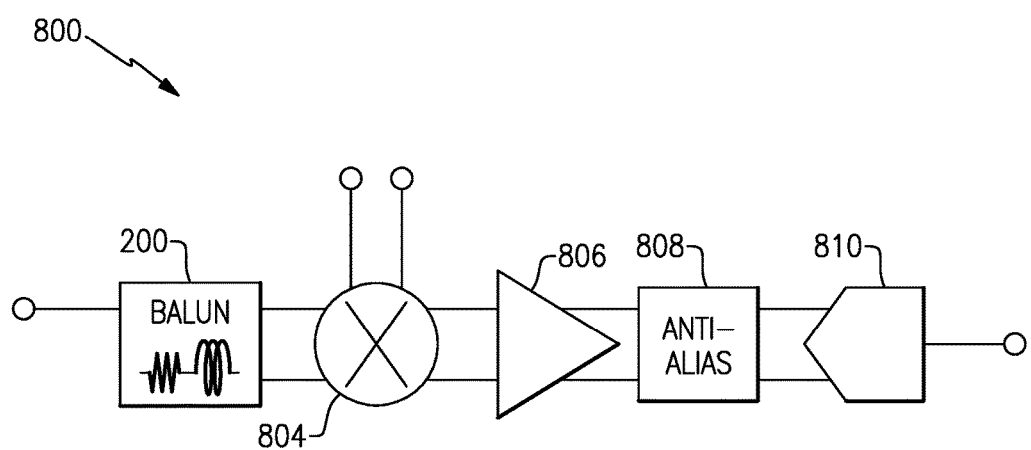
FIG. 8A is a schematic diagram of a receiver system using a coupled-line balun with common-mode nulling according to one embodiment.
Figure 8B:
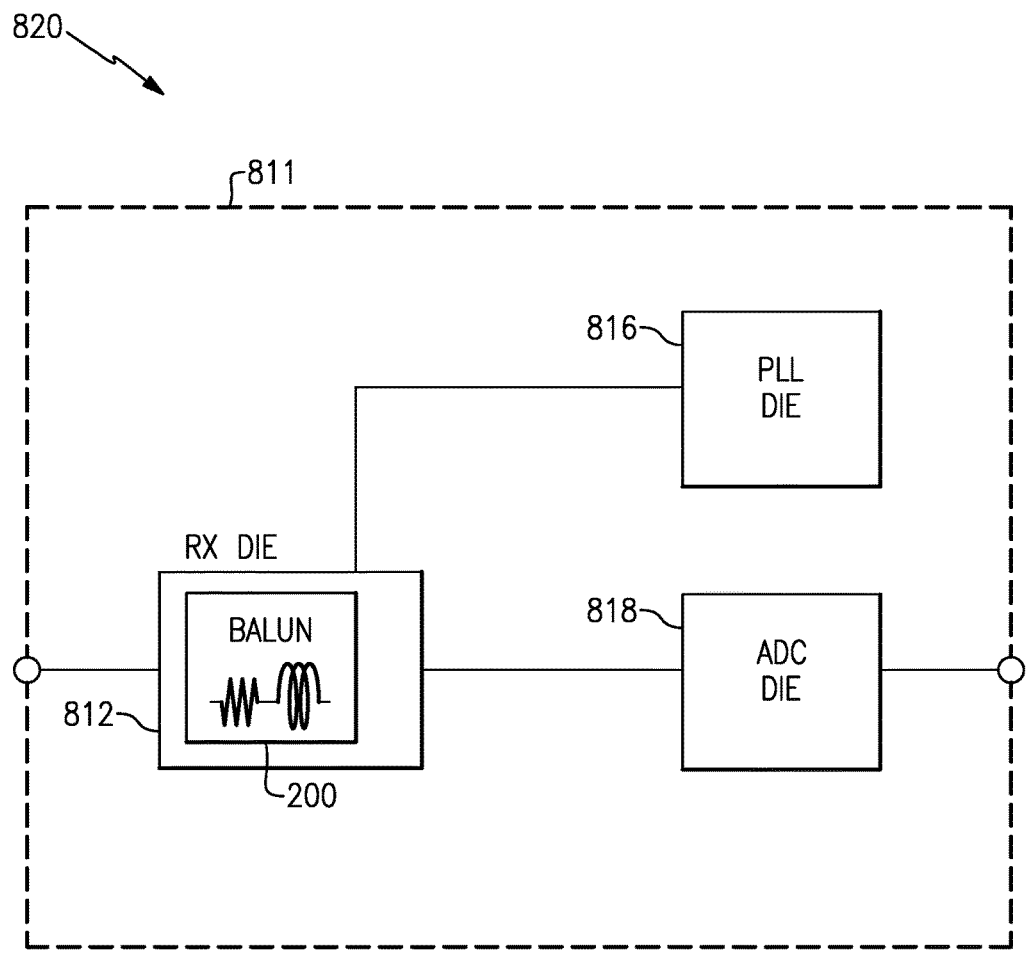
FIG. 8B is a schematic diagram of a receiver system using a coupled-line balun with common-mode nulling according to one embodiment.
Figure 8C:
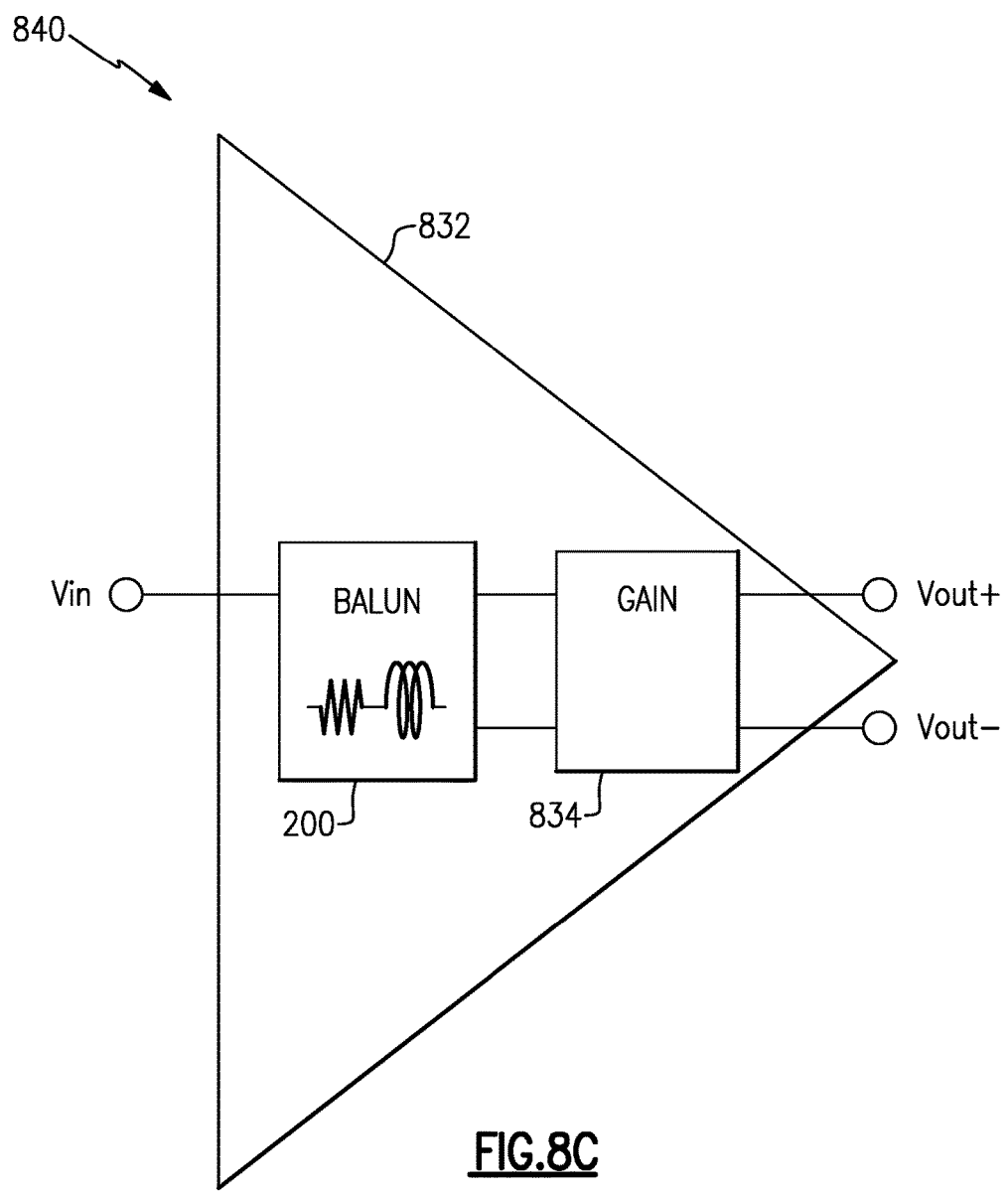
FIG. 8C is a schematic diagram of an amplifier using a coupled-line balun with common-mode nulling according to one embodiment.

FIGS. 8A-8C illustrate three examples of electronic systems that can include baluns. Although three example electronic systems are shown, the baluns herein can be used in a wide variety of applications. Accordingly, baluns can be used in other implementations of electronic systems.

FIG. 8A is a schematic diagram of a receiver system 800 using a coupled-line balun with common-mode nulling according to one embodiment.

The receiver system 800 includes the coupled-line balun 200, a mixer 804, an amplifier 806, an anti-alias filter 808, and an analog-to-digital converter (ADC) 810, which are connected in series in a signal path of the receiver system 800. The coupled-line balun 200 can be the coupled-line balun 200 of FIG. 2 using the compensating series resistor 110 and inductor 108 to improve common-mode rejection at lower frequencies. In this way, the coupled-line balun 200 can convert an unbalanced signal to a differential signal at the input for feeding to the mixer 804 with enhanced performance at frequencies at or near at or near the minimum length-dominated frequency.

A performance specification of the receiver system 800 can be common-mode rejection of any unbalanced signal received at the input of the receiver system 800. Any unwanted common-mode signals introduced by way of the mixer 804 are passed through the amplifier 806, the anti-alias filter 808, and into the ADC 810.

Accordingly, it can be advantageous to use a coupled-line balun 200 to provide high common-mode rejection over as large a bandwidth as possible. By using the series resistor 110 and the inductor 108 to null the common-mode S21 at a nulling frequency, bandwidth can be extended to lower frequencies of operation so that there is reduced common-mode feed through into the signal path over a larger bandwidth.

FIG. 8B is a schematic diagram of a receiver system 811 using a coupled-line balun with common-mode nulling according to one embodiment. The receiver system 811 includes a receiver (RX) integrated circuit (IC) or die 812, a phase locked loop (PLL) die 816, and an ADC die 818. The PLL die 816 can provide a local oscillator (LO) signal to the RX die 812 to mix with the received signal for down-conversion. The ADC die 818 can be used to convert a down-converted signal to a digital signal for processing in the digital domain. The RX die 812 can include the coupled-line balun 200 for improving the common-mode rejection at lower frequencies of operation.

FIG. 8C is a schematic diagram of an amplifier 832 using a coupled-line balun with common-mode nulling according to one embodiment.

The amplifier 832 includes the coupled-line balun 200 and a differential gain stage 834 connected in series between an unbalanced input and a differential output. The amplifier 832 can receive an unbalanced signal Vin at its input and provide a differential output signal with a positive voltage output Vout+ and a negative voltage output Vout− and have common-mode rejection determined, in part, by the common-rejection of the coupled-line balun 200. By using the coupled-line balun 200 with a compensating series resistor 110 and inductor 108 as in FIG. 1A, the common-mode rejection of the amplifier 832 can be extended to lower frequencies by reducing the amount of common-mode feedthrough introduced into the differential gain stage 834.

Applications

Any of the principles and advantages discussed herein can be applied to other systems, not just to the systems described above.

Accordingly, aspects of this disclosure can be implemented in various electronic devices. For instance, one or more of the above coupled-line baluns implemented in accordance with any of the principles and advantages discussed herein can be included in various electronic devices. Examples of the electronic devices can include, but are not limited to, consumer electronic products, parts of the consumer electronic products such as semiconductor die and/or packaged modules, electronic test equipment, wireless communication devices, etc. Examples of the electronic devices can also include communication networks. The consumer electronic products can include, but are not limited to, a phone such as a smart phone, a laptop computer, a tablet computer, a wearable computing device such as a smart watch or an ear piece, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and/and automotive applications.

Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Some of the embodiments described above have provided examples in connection with coupled-line baluns. However, any suitable principles and advantages of the embodiments can be applied to baluns as appropriate. More generally, any of the principles and advantages discussed herein can be implemented in connection with any other systems, apparatus, or methods that benefit could from any of the teachings herein. For instance, any of the principles and advantages discussed herein can be implemented in connection with any micro-strip balun fabricated in an MMIC process.

Conclusion

Unless the context clearly requires otherwise, throughout the description, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An electronic system with common-mode compensation, the electronic system comprising:
    a substrate; and
    a coupled-line balun over the substrate, wherein the coupled-line balun comprises:
        a first stripline including a first end configured to carry an unbalanced signal and a second end configured to carry a first component of a balanced signal;
        a second stripline adjacent to the first stripline and including a first end configured to receive a reference voltage and a second end configured to carry a second component of the balanced signal; and
        a series resistor-inductor (RL) network comprising a resistor and an inductor electrically connected in series between the second end of the first stripline and the reference voltage, wherein the series RL network is operable to control a common-mode response characteristic of the coupled-line balun.

2. The electronic system of claim 1, wherein at least one of a resistance of the resistor or an inductance of the inductor is controllable.

3. The electronic system of claim 2, wherein the resistor comprises a plurality of selectable resistance elements, wherein the coupled-line balun further comprises a switch network configured to control the resistance of the resistor by controlling selection of the selectable resistance elements.

4. The electronic system of claim 3, further comprising a serial interface configured to receive data operable to control the selection of the selectable resistance elements by the switch network.

5. The electronic system of claim 1, wherein the coupled-line balun is configured to transform the balanced signal into the unbalanced signal.

6. The electronic system of claim 1, wherein the coupled-line balun is configured to transform the unbalanced signal into the balanced signal.

7. The electronic system of claim 1, wherein the resistor is electrically connected between the reference voltage and the inductor.

8. The electronic system of claim 1, wherein the inductor is electrically connected between the reference voltage and the resistor.

9. The electronic system of claim 1, wherein a resistance of the resistor is in a range of 10Ω to 100Ω, and an inductance of the inductor is in a range of 10 nH to 30 nH.

10. A method of signal transformation with common-mode compensation, the method comprising:
    providing signal transformation using a coupled-line balun that includes a first transmission line configured to transfer energy to a second transmission line through an electromagnetic field, including handling an unbalanced signal using a first terminal of the coupled-line balun, handling a first component of a balanced signal using a second terminal of the coupled-line balun, and handling a second component of the balanced signal using a third terminal of the coupled-line balun;
    receiving a reference voltage for the unbalanced signal at a fourth terminal of the coupled-line balun; and
    controlling a common-mode response of the coupled-line balun using a series resistor-inductor (RL) network connected between the second terminal and the fourth terminal.

11. The method of claim 10, further comprising changing a frequency location of a common-mode nulling frequency by tuning at least one of a resistance of the resistor or an inductance of the inductor.

12. The method of claim 10, further comprising nulling the common-mode response of the coupled-line balun to extend a low-end frequency range of the coupled-line balun.

13. The method of claim 10, further comprising mixing the balanced signal using a mixer, and using the series RL network to inhibit common-mode feedthrough from the first terminal of the coupled-line balun to an output of the mixer.

14. The method of claim 10, further comprising compensating for manufacturing variation by controlling at least one of a resistance of the resistor or an inductance of the inductor.

15. A coupled-line balun with common-mode compensation, the coupled-line balun comprising:
    a first terminal configured to carry an unbalanced signal;
    a second terminal configured to carry a first component of a balanced signal;
    a third terminal configured to carry a second component of the balanced signal;
    a fourth terminal configured to receive a reference voltage for the unbalanced signal; and
    a series resistor-inductor (RL) network electrically connected between the second terminal and the fourth terminal, wherein the second terminal is coupled through the series RL network to ground, and wherein the first terminal is coupled through the second terminal to the series RL network.

16. The coupled-line balun of claim 15, wherein at least one of a resistance of the series RL network or an inductance of the series RL network is tunable to control a common-mode response of the coupled-line balun.

17. The coupled-line balun of claim 15, wherein the series RL network comprises a plurality of selectable resistance elements, wherein the coupled-line balun further comprises a switch network configured to control a resistance of the series RL network by controlling selection of the selectable resistance elements.

18. The coupled-line balun of claim 15, wherein the series RL network is operable to control a nulling frequency of a common-mode response of the coupled-line balun.

19. The coupled-line balun of claim 15, wherein the coupled-line balun includes a first stripline and a second stripline positioned over a substrate, wherein the first terminal corresponds to a first end of the first stripline, the fourth terminal corresponds to a first end of the second stripline, the second terminal corresponds to a second end of the first stripline, and the third terminal corresponds to a second end of the second stripline.

20. The coupled-line balun of claim 15, implemented on a semiconductor die, a printed circuit board, or a module substrate.

\* \* \* \* \*